(12) United States Patent
Ashizawa et al.

(10) Patent No.: US 12,326,612 B2
(45) Date of Patent: Jun. 10, 2025

(54) VIBRATOR AND VIBRATION WAVE MOTOR

(71) Applicant: NIKON CORPORATION, Tokyo (JP)

(72) Inventors: Takatoshi Ashizawa, Yokohama (JP);
Kazutaka Watanabe, Fuji (JP);
Hirofumi Takahashi, Fuji (JP)

(73) Assignee: NIKON CORPORATION, Tokyo (JP)

( * ) Notice: Subject to any disclaimer, the term of this patent is extended or adjusted under 35 U.S.C. 154(b) by 382 days.

(21) Appl. No.: 17/927,195

(22) PCT Filed: Mar. 22, 2021

(86) PCT No.: PCT/JP2021/011795
§ 371 (c)(1),
(2) Date: Nov. 22, 2022

(87) PCT Pub. No.: WO2021/246028
PCT Pub. Date: Dec. 9, 2021

(65) Prior Publication Data
US 2023/0221519 A1    Jul. 13, 2023

(30) Foreign Application Priority Data
Jun. 4, 2020  (JP) .................. 2020-097583

(51) Int. Cl.
*G02B 7/08*   (2021.01)
*C04B 35/495*  (2006.01)
(Continued)

(52) U.S. Cl.
CPC .............. *G02B 7/08* (2013.01); *C04B 35/495* (2013.01); *H02N 2/163* (2013.01);
(Continued)

(58) Field of Classification Search
CPC .......... G02B 7/08; G02B 7/008; G02B 7/021; G02B 7/023; G03B 3/10;
(Continued)

(56) References Cited

U.S. PATENT DOCUMENTS 7,468,143 B2 * 12/2008 Takeda ................. H10N 30/853
                                              310/365
2015/0249201 A1    9/2015 Furukawa et al.
2020/0350838 A1   11/2020 Ashizawa

FOREIGN PATENT DOCUMENTS

| JP | H1-17354 B2 | 3/1989 |
|---|---|---|
| JP | 2015-180585 A | 10/2015 |
| WO | 2019/078239 A1 | 4/2019 |

OTHER PUBLICATIONS

Dec. 6, 2022 International Report on Patentability issued in International Patent Application No. PCT/JP2021/011795.
(Continued)

*Primary Examiner* — Emily P Pham
(74) *Attorney, Agent, or Firm* — Oliff PLC

(57) ABSTRACT

A vibrator includes an electromechanical transducer which is a piezoelectric ceramic made of sodium-potassium niobate metal oxides and whose temperature characteristics of a relative permittivity is 500 [ppm/° C.] or less in absolute value in a temperature range from −40° C. to 170° C., wherein excitation of the electromechanical transducer produces a vibration wave. Another vibrator includes an electromechanical transducer which is a piezoelectric ceramic made of sodium-potassium niobate metal oxides and whose temperature characteristics of a relative permittivity is 390 [ppm/° C.] or less in absolute value in a temperature range from 0° C. to 60° C., wherein excitation of the electromechanical transducer produces a vibration wave.

13 Claims, 26 Drawing Sheets

(51) Int. Cl.
  *H02N 2/16* (2006.01)
  *H10N 30/853* (2023.01)
(52) U.S. Cl.
  CPC . *H10N 30/8542* (2023.02); *C04B 2235/3236* (2013.01); *C04B 2235/3255* (2013.01); *C04B 2235/327* (2013.01)
(58) Field of Classification Search
  CPC .......... G03B 2205/0061; C04B 35/495; C04B 2235/3236; C04B 2235/3255; C04B 2235/327; H02N 2/163; H02N 2/004; H02N 2/026; H10N 30/8542
  See application file for complete search history.

(56) References Cited

OTHER PUBLICATIONS

Jun. 1, 2021 Search Report issued in International Patent Application No. PCT/JP2021/011795.
Zhang et al., "(K0.5Na0.5)NbO3 Based Lead Free Piezoelectrics with Expanded Temperature Usage Range," Applicants of Ferroelectrics, Feb. 2008, ISAF 2008, 17th IEEE International Symposium, pp. 1-2.
Skidmore et al., "Phase Diagram and Structure-Property Relationships in the Lead-Free Piezoelectric System: Na0.5K0.5NbO3-LiTaO3" IEEE Transactions on Ultrasonic, Ferroelectrics, and Frequency Control, Sep. 2011, vol. 5, No. 9, pp. 1819-1825.
Aug. 12, 2024 Extended Search Report issued in European Patent Application No. 21818296.2.

\* cited by examiner

| MATERIAL | A [mol] | B [mol] | C [mol] | D [mol] | E [mol] | ELECTROMECHANICAL COUPLING FACTOR Kp[%] | RELATIVE PERMITTIVITY $\varepsilon^T_{33}/\varepsilon_0$ | PIEZOELECTRIC CONSTANT $d_{33}$ [pC/N] | TEMPERATURE CHARACTERISTICS OF RELATIVE PERMITTIVITY [ppm/°C] | |
|---|---|---|---|---|---|---|---|---|---|---|
| | | | | | | | | | (-40~170°C) | (0~60°C) |
| MATERIAL α | 0.060 | 0.500 | 0.050 | 0.830 | 0.005 | 42.0 | 1182 | 229 | -447 | -390 |
| MATERIAL β | 0.055 | 0.500 | 0.050 | 0.830 | 0.005 | 46.1 | 1399 | 229 | 467 | -58 |
| MATERIAL γ | 0.055 | 0.500 | 0.050 | 0.830 | 0.005 | 45.7 | 1461 | 224 | 465 | 195 |
| No.1 | 0.060 | 0.400 | 0.050 | 0.830 | 0.005 | 40.6 | 1272 | 183 | -432 | -398 |
| No.3 | 0.060 | 0.600 | 0.050 | 0.830 | 0.005 | 39.7 | 1395 | 185 | -445 | -391 |
| No.4 | 0.060 | 0.500 | 0.100 | 0.830 | 0.005 | 37.2 | 1880 | 206 | 496 | 420 |
| No.5 | 0.060 | 0.500 | 0.050 | 0.170 | 0.005 | 28.1 | 1036 | 121 | -283 | -278 |
| No.6 | 0.060 | 0.500 | 0.050 | 0.660 | 0.005 | 45.9 | 1382 | 239 | 150 | -326 |
| No.7 | 0.060 | 0.500 | 0.050 | 0.830 | 0.010 | 40.1 | 1325 | 197 | 288 | -24 |
| No.8 | 0.100 | 0.400 | 0.050 | 0.830 | 0.005 | 30.6 | 1043 | 118 | -328 | -312 |
| No.9 | 0.100 | 0.500 | 0.050 | 0.830 | 0.005 | 32.5 | 1128 | 134 | -310 | -296 |
| No.10 | 0.100 | 0.600 | 0.050 | 0.830 | 0.005 | 29.6 | 1005 | 103 | -335 | -322 |
| No.11 | 0.100 | 0.500 | 0.100 | 0.830 | 0.005 | 27.3 | 1340 | 132 | 486 | 203 |
| No.12 | 0.100 | 0.500 | 0.050 | 0.170 | 0.005 | 23.8 | 1008 | 101 | -247 | -235 |
| No.13 | 0.100 | 0.500 | 0.050 | 0.660 | 0.005 | 29.8 | 1014 | 114 | 143 | -236 |
| No.14 | 0.100 | 0.500 | 0.050 | 0.830 | 0.010 | 25.9 | 1028 | 105 | 279 | -22 |

IN ADDITION TO THESE INGREDIENTS, 0.1 wt% OF Cu IS ADDED TO MATERIAL γ.

FIG. 6

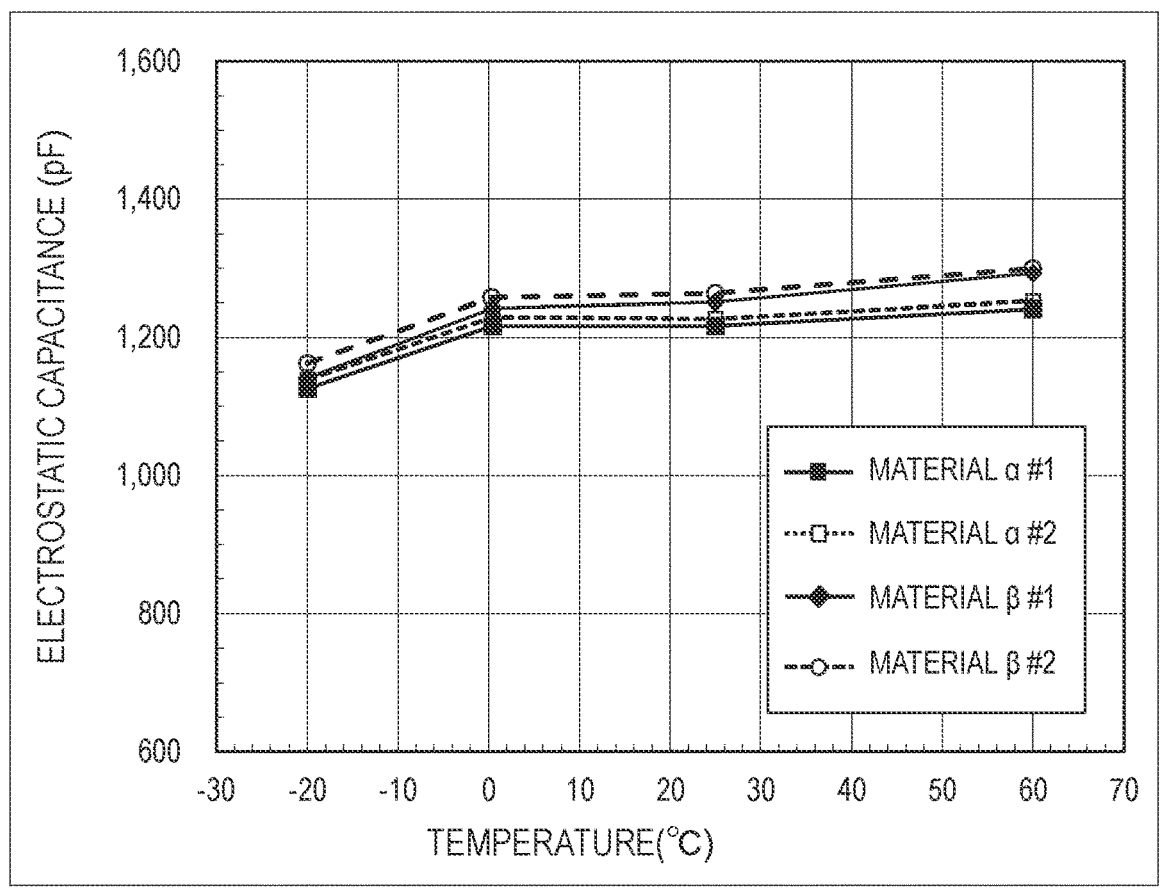
*FIG. 8A1*

| SAMPLE | TEMPERATURE [°C] | ELECTROSTATIC CAPACITANCE [pF] | | |
|---|---|---|---|---|
| MATERIAL α #1 | -20 | 1125.5 | CHANGE PERCENTAGE AT TIME OF -20°C WITH RESPECT TO TIME OF 60°C | 9.31% |
| | 0.5 | 1217 | CHANGE PERCENTAGE AT TIME OF 0°C WITH RESPECT TO TIME OF 60°C | 1.93% |
| | 25 | 1217 | CHANGE PERCENTAGE AT TIME OF 0°C WITH RESPECT TO TIME OF 25°C | 0.00% |
| | 60 | 1241 | | |
| MATERIAL α #2 | -20 | 1138.5 | CHANGE PERCENTAGE AT TIME OF -20°C WITH RESPECT TO TIME OF 60°C | 9.10% |
| | 0.5 | 1229.5 | CHANGE PERCENTAGE AT TIME OF 0°C WITH RESPECT TO TIME OF 60°C | 1.84% |
| | 25 | 1227 | CHANGE PERCENTAGE AT TIME OF 0°C WITH RESPECT TO TIME OF 25°C | -0.20% |
| | 60 | 1252.5 | | |
| MATERIAL β #1 | -20 | 1141 | CHANGE PERCENTAGE AT TIME OF -20°C WITH RESPECT TO TIME OF 60°C | 11.69% |
| | 0.5 | 1242.5 | CHANGE PERCENTAGE AT TIME OF 0°C WITH RESPECT TO TIME OF 60°C | 3.83% |
| | 25 | 1250.5 | CHANGE PERCENTAGE AT TIME OF 0°C WITH RESPECT TO TIME OF 25°C | 0.64% |
| | 60 | 1292 | | |
| MATERIAL β #2 | -20 | 1162.5 | CHANGE PERCENTAGE AT TIME OF -20°C WITH RESPECT TO TIME OF 60°C | 10.51% |
| | 0.3 | 1257.5 | CHANGE PERCENTAGE AT TIME OF 0°C WITH RESPECT TO TIME OF 60°C | 3.19% |
| | 25 | 1263.5 | CHANGE PERCENTAGE AT TIME OF 0°C WITH RESPECT TO TIME OF 25°C | 0.47% |
| | 60 | 1299 | | |

*FIG. 8A2*

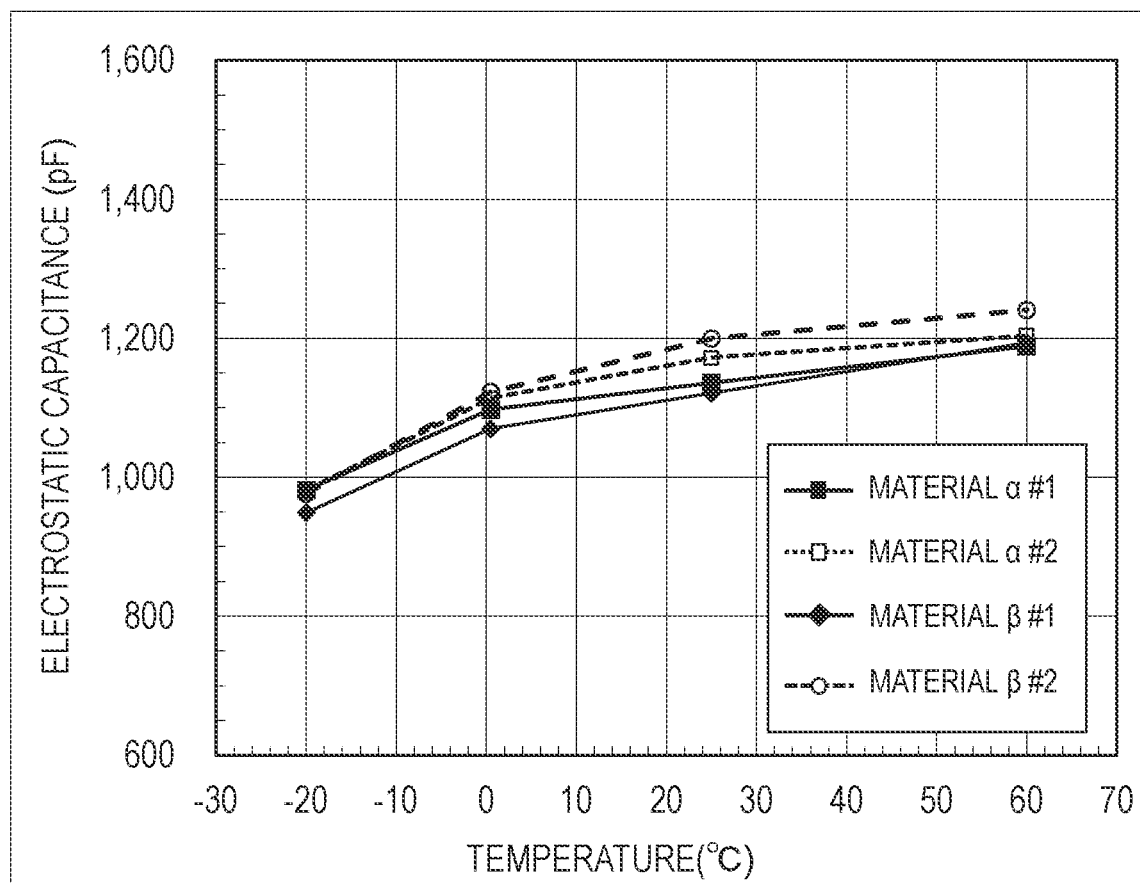
FIG. 9A1

| SAMPLE | | TEMPERATURE [°C] | ELECTROSTATIC CAPACITANCE [pF] | | |
|---|---|---|---|---|---|
| MATERIAL α #1 | | -20 | 981 | CHANGE PERCENTAGE AT TIME OF -20°C WITH RESPECT TO TIME OF 60°C | 17.42% |
| | | 0.5 | 1097.5 | CHANGE PERCENTAGE AT TIME OF 0°C WITH RESPECT TO TIME OF 60°C | 7.62% |
| | | 25 | 1135.5 | CHANGE PERCENTAGE AT TIME OF 0°C WITH RESPECT TO TIME OF 25°C | 3.35% |
| | | 60 | 1188 | | |
| MATERIAL α #2 | | -20 | 980.5 | CHANGE PERCENTAGE AT TIME OF -20°C WITH RESPECT TO TIME OF 60°C | 18.53% |
| | | 0.5 | 1113.5 | CHANGE PERCENTAGE AT TIME OF 0°C WITH RESPECT TO TIME OF 60°C | 7.48% |
| | | 25 | 1172 | CHANGE PERCENTAGE AT TIME OF 0°C WITH RESPECT TO TIME OF 25°C | 4.99% |
| | | 60 | 1203.5 | | |
| MATERIAL β #1 | | -20 | 948.5 | CHANGE PERCENTAGE AT TIME OF -20°C WITH RESPECT TO TIME OF 60°C | 20.49% |
| | | 0.5 | 1069.5 | CHANGE PERCENTAGE AT TIME OF 0°C WITH RESPECT TO TIME OF 60°C | 10.35% |
| | | 25 | 1121 | CHANGE PERCENTAGE AT TIME OF 0°C WITH RESPECT TO TIME OF 25°C | 4.59% |
| | | 60 | 1193 | | |
| MATERIAL β #2 | | -20 | 976 | CHANGE PERCENTAGE AT TIME OF -20°C WITH RESPECT TO TIME OF 60°C | 21.32% |
| | | 0.5 | 1122.5 | CHANGE PERCENTAGE AT TIME OF 0°C WITH RESPECT TO TIME OF 60°C | 9.51% |
| | | 25 | 1199.5 | CHANGE PERCENTAGE AT TIME OF 0°C WITH RESPECT TO TIME OF 25°C | 6.42% |
| | | 60 | 1240.5 | | |

FIG. 9A2

| SAMPLE | TEMPERATURE [°C] | CONSUMPTION CURRENT [mA] | |
|---|---|---|---|
| MATERIAL α | -20.5 | 140.89 | CHANGE PERCENTAGE AT TIME OF -20°C WITH RESPECT TO TIME OF 50°C | 11.22% |
| | 0.5 | 152.64 | CHANGE PERCENTAGE AT TIME OF 0°C WITH RESPECT TO TIME OF 50°C | 3.82% |
| | 25 | 159.04 | CHANGE PERCENTAGE AT TIME OF 0°C WITH RESPECT TO TIME OF 25°C | 4.02% |
| | 50.5 | 158.7 | | |
| MATERIAL β | -20.5 | 142.84 | CHANGE PERCENTAGE AT TIME OF -20°C WITH RESPECT TO TIME OF 50°C | 10.79% |
| | 0.5 | 153.61 | CHANGE PERCENTAGE AT TIME OF 0°C WITH RESPECT TO TIME OF 50°C | 4.06% |
| | 25 | 158.85 | CHANGE PERCENTAGE AT TIME OF 0°C WITH RESPECT TO TIME OF 25°C | 3.30% |
| | 50.5 | 160.11 | | |
| MATERIAL γ | -20.5 | 149.5 | CHANGE PERCENTAGE AT TIME OF -20°C WITH RESPECT TO TIME OF 60°C | 7.25% |
| | 0.5 | 156.92 | CHANGE PERCENTAGE AT TIME OF 0°C WITH RESPECT TO TIME OF 60°C | 2.64% |
| | 25 | 160.68 | CHANGE PERCENTAGE AT TIME OF 0°C WITH RESPECT TO TIME OF 25°C | 2.34% |
| | 50.5 | 161.18 | | |

*FIG. 10B*

DRIVABLE VOLTAGE OF VIBRATION WAVE MOTOR

| ENVIRONMENTAL TEMPERATURE [°C] | MATERIAL α | | MATERIAL β | | MATERIAL γ | | PZT |
|---|---|---|---|---|---|---|---|
| | SAMPLE1 | SAMPLE2 | SAMPLE3 | SAMPLE4 | SAMPLE5 | SAMPLE6 | |
| -20 | 58 | 60 | 63 | 60 | 58 | 50 | |
| 0 | 53 | 55 | 58 | 53 | 53 | 48 | 65 |
| 25 | 50 | 50 | 53 | 50 | 50 | 45 | 50 |
| 50 | 50 | 48 | 53 | 53 | 48 | 40 | 45 |

[UNIT : Vrms]

*FIG. 12*

| SAMPLE | TEMPERATURE [°C] | ELECTROSTATIC CAPACITANCE [pF] | |
|---|---|---|---|
| #1 | -20.5 | 1105 | |
| | 25.2 | 1346.993 | CHANGE PERCENTAGE AT TIME OF -20°C WITH RESPECT TO TIME OF 60°C 31.17% |
| | 60.1 | 1605.3 | |
| #2 | -20.5 | 1085.5 | |
| | 25.2 | 1336.464 | CHANGE PERCENTAGE AT TIME OF -20°C WITH RESPECT TO TIME OF 60°C 32.65% |
| | 60.1 | 1611.7 | |
| #3 | -20.5 | 1130.7 | |
| | 25.2 | 1368.513 | CHANGE PERCENTAGE AT TIME OF -20°C WITH RESPECT TO TIME OF 60°C 30.29% |
| | 60.1 | 1621.9 | |
| #4 | -20.5 | 1117.8 | |
| | 25.2 | 1361.221 | CHANGE PERCENTAGE AT TIME OF -20°C WITH RESPECT TO TIME OF 60°C 31.02% |
| | 60.1 | 1620.5 | |

*FIG. 19B*

VIBRATOR AND VIBRATION WAVE MOTOR

CLAIM OF PRIORITY

The present application claims priority from Japanese patent application JP 2020-97583 filed on Jun. 4, 2020, the content of which is hereby incorporated by reference into this application.

BACKGROUND

The disclosure relates to a vibrator and a vibration wave motor.

As disclosed in JP 01-017354 B2, a vibration wave motor produces a traveling vibration wave (abbreviated as a traveling wave below) on a driving surface of an elastic body by using expansion and contraction of a piezoelectric body, this traveling wave causes an elliptical motion on the driving surface, and a mover placed in pressure contact with a crest of the elliptical motion is driven. However, JP 01-017354 B2 does not take into account a decrease in driving performance caused by a material of the piezoelectric body.

SUMMARY

A vibrator of a first disclosure comprises an electromechanical transducer which is a piezoelectric ceramic made of sodium-potassium niobate metal oxides and whose temperature characteristics of a relative permittivity is 500 [ppm/° C.] or less in absolute value in a temperature range from −40° C. to 170° C., wherein excitation of the electromechanical transducer produces a vibration wave.

A vibrator of a second disclosure comprises an electromechanical transducer which is a piezoelectric ceramic made of sodium-potassium niobate metal oxides and whose temperature characteristics of a relative permittivity is 390 [ppm/° C.] or less in absolute value in a temperature range from 0° C. to 60° C., wherein excitation of the electromechanical transducer produces a vibration wave.

A vibration wave motor of a third disclosure comprises: the vibrator according to any one of the first and second disclosure; and a relative motion member which includes a sliding surface placed in pressure contact with a driving surface of the vibrator, and is caused to make a relative motion by the vibration wave.

BRIEF DESCRIPTION OF THE DRAWINGS

FIG. 6 is a table illustrating constants (A to E), an electromechanical coupling factor, a relative permittivity, a piezoelectric constant, and temperature characteristics of the relative permittivity (change percentage) of chemical formula (1) of each material.

FIG. 8A1 is a graph illustrating temperature characteristics of electrostatic capacitances of materials α and β of the piezoelectric body according to embodiment 1 (part 1).

FIG. 8A2 is a graph illustrating temperature characteristics of electrostatic capacitances of materials α and β of the piezoelectric body according to embodiment 1 (part 2).

FIG. 9A1 is a graph illustrating temperature characteristics of electrostatic capacitances of the vibrator in a case where the materials α and β are used (part 1).

FIG. 9A2 is a graph illustrating temperature characteristics of electrostatic capacitances of the vibrator in a case where the materials α and β are used (part 2).

FIG. 10B is a graph illustrating a measured consumption current at each temperature for the vibration wave motor according to embodiment 1 and a vibration wave motor which is a PZT-mounted product (part 2).

FIG. 12 is a table showing a lowest voltage (referred to a drivable voltage below) of a drive signal which can drive the vibration wave motor according to embodiment 1.

FIG. 19B is a graph illustrating an example of temperature characteristics of an electrostatic capacitance of the vibrator of the vibration wave motor in a case where the PZT in FIG. 18 is a piezoelectric body material (part 2).

DETAILED DESCRIPTION OF THE EMBODIMENTS

A vibration wave motor produces a traveling wave on a driving surface of an elastic body by using expansion and contraction of a piezoelectric body, this traveling wave causes an elliptical motion on the driving surface, and a mover placed in pressure contact with a crest of the elliptical motion is driven. Features of the vibration wave motor include that the vibration wave motor has a high torque even in a case of low rotation, and in a case where the vibration wave motor is mounted on a driving device, a gear of the driving device can be omitted. Consequently, by canceling gear noise, it is possible to achieve noise reduction, and improve positioning accuracy.

A vibrator of this vibration wave motor generally includes an electromechanical transducer (abbreviated as a piezoelectric body below) and an elastic body. The piezoelectric body is generally formed by a material such as lead zirconate titanate which is commonly called PZT.

Figure 18:
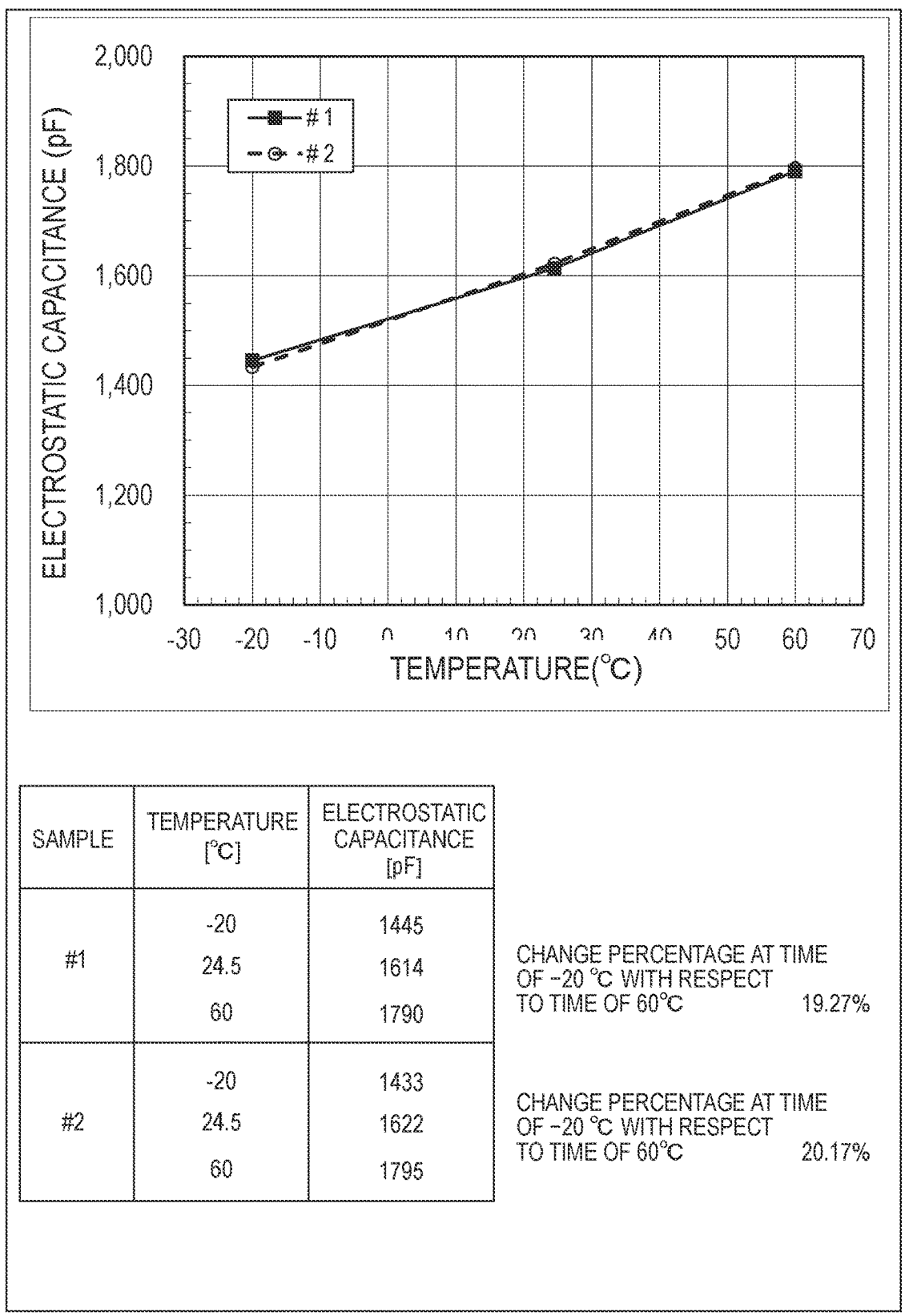
FIG. 18 is a graph illustrating an example of temperature characteristics of an electrostatic capacitance of PZT (made by Fuji Ceramics Corporation) which is a material of the piezoelectric body prepared for the vibration wave motor.

FIG. 18 is a graph illustrating an example of temperature characteristics of an electrostatic capacitance of PZT (made by Fuji Ceramics Corporation) which is a material of the piezoelectric body prepared for the vibration wave motor. It is found that the electrostatic capacitance has an inclination of approximately 4.4 [pF/° C.] (≈2750 [ppm/° C.]) with respect to a temperature.

Figure 19A:
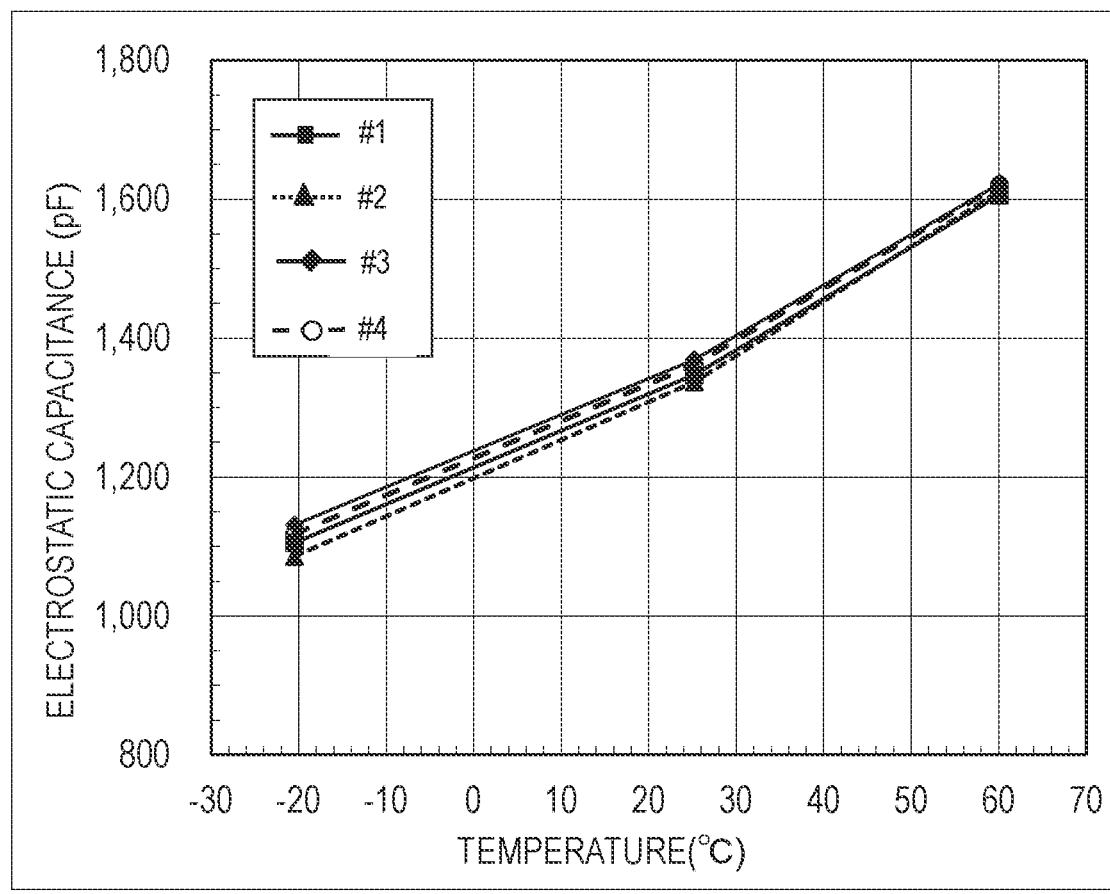
FIG. 19A is a graph illustrating an example of temperature characteristics of an electrostatic capacitance of the vibrator of the vibration wave motor in a case where the PZT in FIG. 18 is a piezoelectric body material (part 1).

FIG. 19A is a graph illustrating an example of temperature characteristics of an electrostatic capacitance of the vibrator of the vibration wave motor in a case where the PZT in FIG. 18 is a piezoelectric body material (part 1). FIG. 19B is a graph illustrating an example of temperature characteristics of an electrostatic capacitance of the vibrator of the vibration wave motor in a case where the PZT in FIG. 18 is a piezoelectric body material (part 2). It is found that the electrostatic capacitances have an inclination of approximately 6.2 [pF/° C.] (≈4430 [ppm/° C.]) with respect to a temperature. This inclination indicates that, for example, when the temperature becomes lower, the electrostatic capacitance of the piezoelectric body decreases more, and, when the temperature becomes higher, the electrostatic capacitance of the piezoelectric body increases more.

Figure 20:
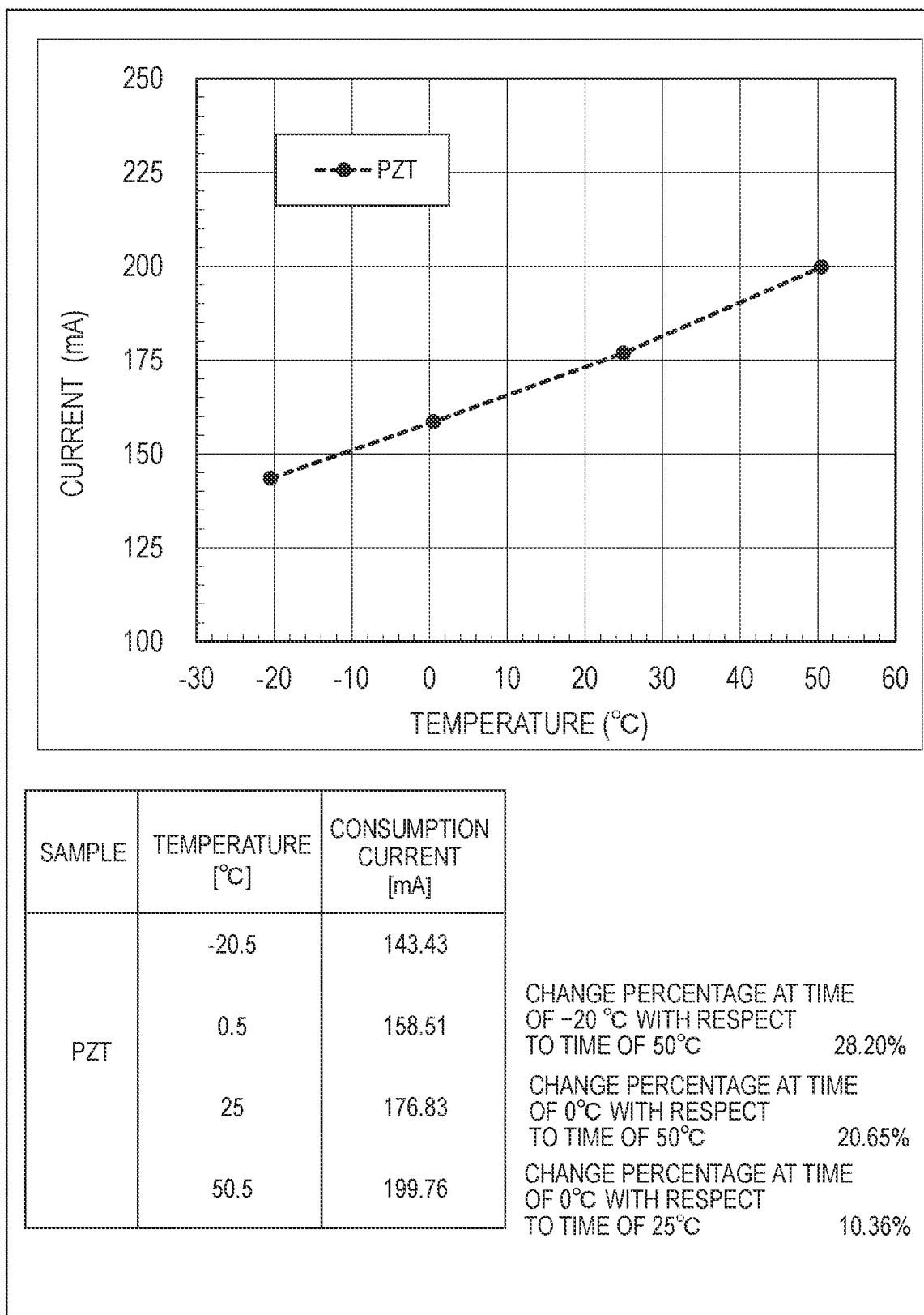
FIG. 20 is a graph obtained by measuring a current input at each temperature for the vibration wave motor of a PZT-mounted product.

FIG. 20 is a graph obtained by measuring a current input at each temperature for the vibration wave motor of a PZT-mounted product. At each time of measurement, a drive voltage was set to 70 [Vrms], and a current input to the vibration wave motor at a time when the vibration wave motor was driven at a predetermined rotation speed was measured. A phenomenon is that, while an input current decreases more when the temperature becomes lower, the input current increases more when the temperature becomes higher compared to a current at a normal temperature. This phenomenon matches with temperature characteristics of an electrostatic capacitance value of the vibrator illustrated in FIGS. 19A and 19B.

Although the electrostatic capacitance of the vibrator decreases more when the temperature becomes lower, an impedance increases, and therefore the input current decreases, the electrostatic capacitance of the vibrator increases more when the temperature becomes higher, the impedance decreases, and therefore the input current increases accordingly. Accordingly, when the temperature becomes higher, the electrostatic capacitance of the vibrator increases more, and therefore the vibration wave motor cannot be efficiently driven.

While the vibration wave motor generates a driving force according to a drive signal supplied from a driving device, and can obtain desired driving performance under a certain drive signal condition such as an appropriate voltage value, and the voltage of this drive signal changes depending on the electrostatic capacitance of the piezoelectric body.

There is also a driving device which includes a matching circuit which matches an impedance of a driving circuit which drives a piezoelectric motor and an impedance of the piezoelectric motor. The PZT has great temperature characteristics as illustrated in FIG. 18, and therefore even when this driving device adjusts a voltage to an appropriate voltage at a normal temperature, a driving voltage at a low temperature and a driving voltage at a high temperature significantly differ. Therefore, it is not possible to sufficiently exhibit driving performance (driving efficiency or a driving force) of the vibration wave motor.

According to the present embodiment, a material free of lead is applied to the piezoelectric body to improve driving performance of the vibration wave motor in order to deal with environmental issues. The vibrator and the vibration wave motor according to the present embodiment will be described below citing embodiment 1 to embodiment 4.

Embodiment 1

<Vibration Wave Motor>

Figure 1:
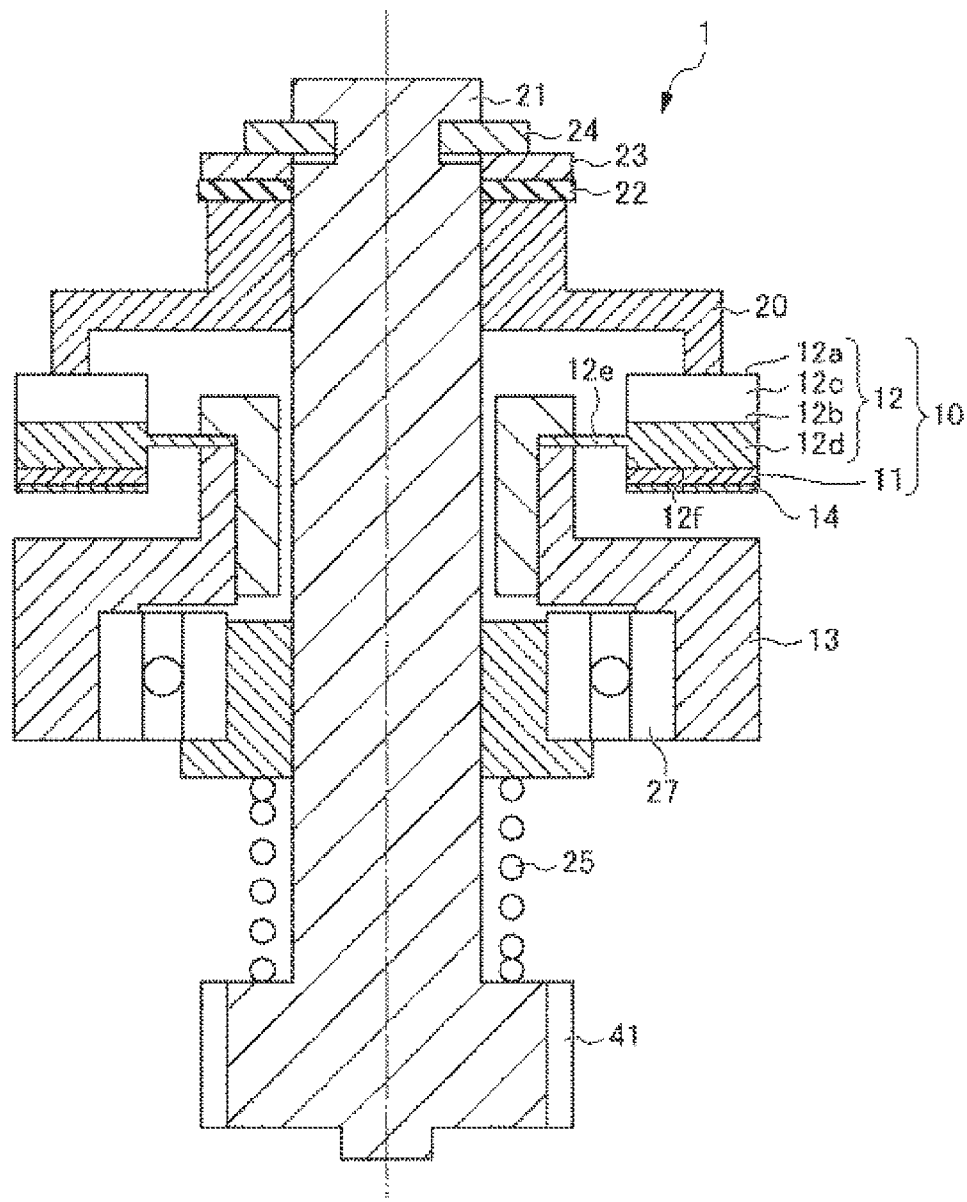
FIG. 1 is a cross-sectional view illustrating a vibration wave motor according to embodiment 1.
Figure 2:
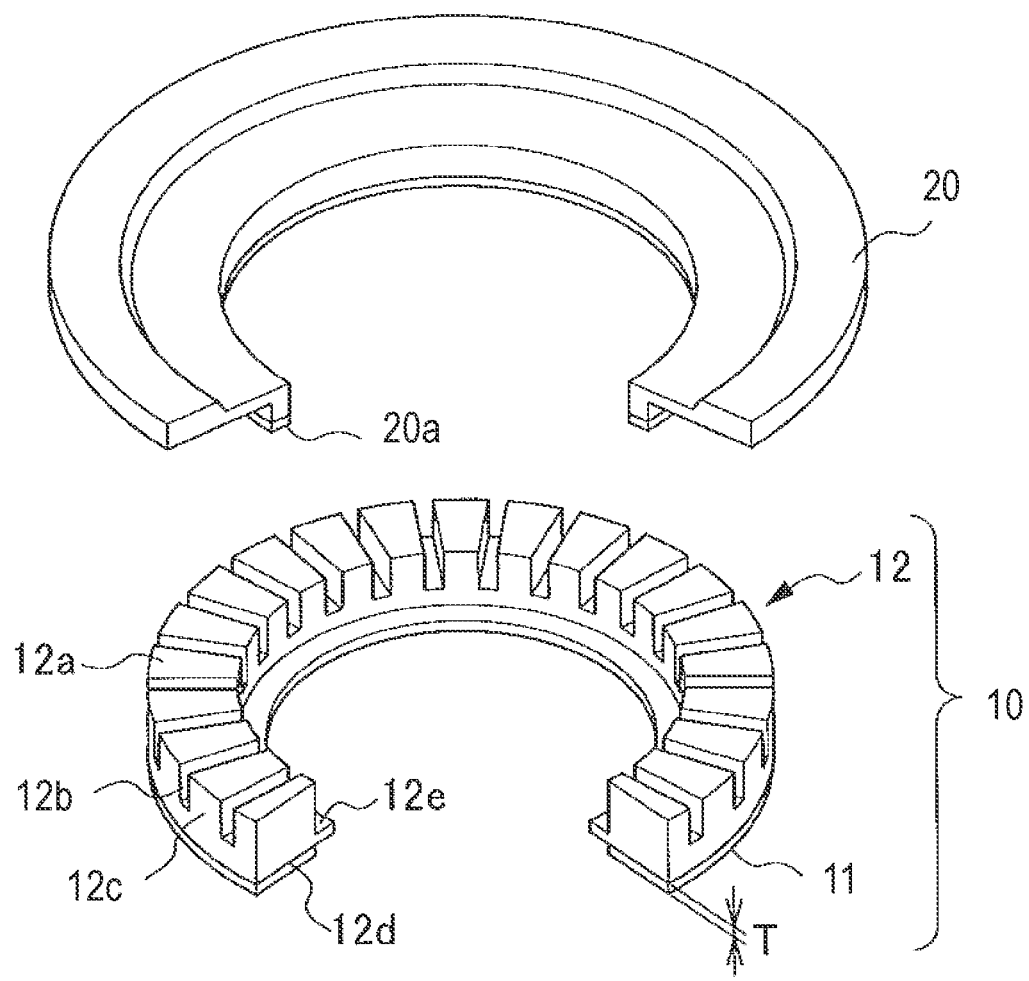
FIG. 2 is a perspective view illustrating that part of a vibrator and a mover are cut out.

FIG. 1 is a cross-sectional view illustrating a vibration wave motor according to embodiment 1. FIG. 2 is a perspective view illustrating that part of a vibrator 10 and a mover 20 are cut out. Embodiment 1 employs a configuration where the vibrator 10 side is fixed, and the mover 20 which is one example of a relative motion member is driven. The mover 20 is made of a light metal such as aluminum. Surface treatment for improving abrasion resistance is performed on a sliding surface 20a of the mover 20.

The vibrator 10 includes an electromechanical transducer (abbreviated as a piezoelectric body below) 11 which is, for example, a piezoelectric element or an electrostrictive element which converts electric energy into mechanical energy, and an elastic body 12 to which the piezoelectric body 11 is bonded, and the vibrator 10 produces a traveling vibration wave.

The elastic body 12 is made of a metal material whose resonance sharpness is great, and has an annular shape. The piezoelectric body 11 is bonded to one surface (bonding surface 12f) of the elastic body 12, and grooves 12b are engraved on a side opposite to this bonding surface 12f. Furthermore, distal ends of protrusion portions (portions without the grooves 12b) 12c become driving surfaces 12a, and are placed in pressure contact with the sliding surface 20a of the mover 20. Lubricant surface treatment is performed on the driving surfaces 12a.

A part at which the grooves 12b of the elastic body 12 are not engraved is a base part 12d, and a flange 12e is extended from the base part 12d to an inner diameter side. An innermost diameter part of the flange 12e is fixed to a fixing member 13. A sliding member such as a coating film or lubricant plating is applied to the protrusion portions 12c of the elastic body 12 to cover the entire protrusion portions 12c.

Although described in detail later, the piezoelectric body 11 is made of a material which is a material free of lead and whose main ingredients are potassium-sodium niobate. A flexible printed circuit board (FPC) 14 is bonded to a surface (opposite bonding surface) of the piezoelectric body 11 on an opposite side to the bonding surface 12f of the elastic body 12 to transmit a drive signal, and extends to a circuit board. Electrodes are arranged on the opposite bonding surface, and form a two-group structure which is grouped into two phases (an A phase and a B phase) along a circumferential direction. The electrodes are arranged in each phase such that the electrodes are alternately polarized per ½ wavelength, and an interval corresponding to a ¼ wavelength is secured between the A phase and the B phase.

An output shaft 21 is coupled to the mover 20 by means of a rubber member 22 and a stopper member 23 inserted to so as to fit to a D cut of the output shaft 21. Furthermore, the output shaft 21 and the stopper member 23 are fixed by an E clip 24, and rotate together with the mover 20.

The rubber member 22 between the stopper member 23 and the mover 20 has a function of coupling the mover 20 and the stopper member 23 by adhesiveness of a rubber, and is suitably, for example, a butyl rubber which has a vibration absorption function of preventing vibration from the mover 20 from transmitting to the output shaft 21. A pressurizing member 25 is provided between an output gear 41 of the output shaft 21 and a bearing 27. According to this structure, the mover 20 is placed in pressure contact with the driving surface 12a of the elastic body 12.

<Driving Device of Vibration Wave Motor>

Figure 3:
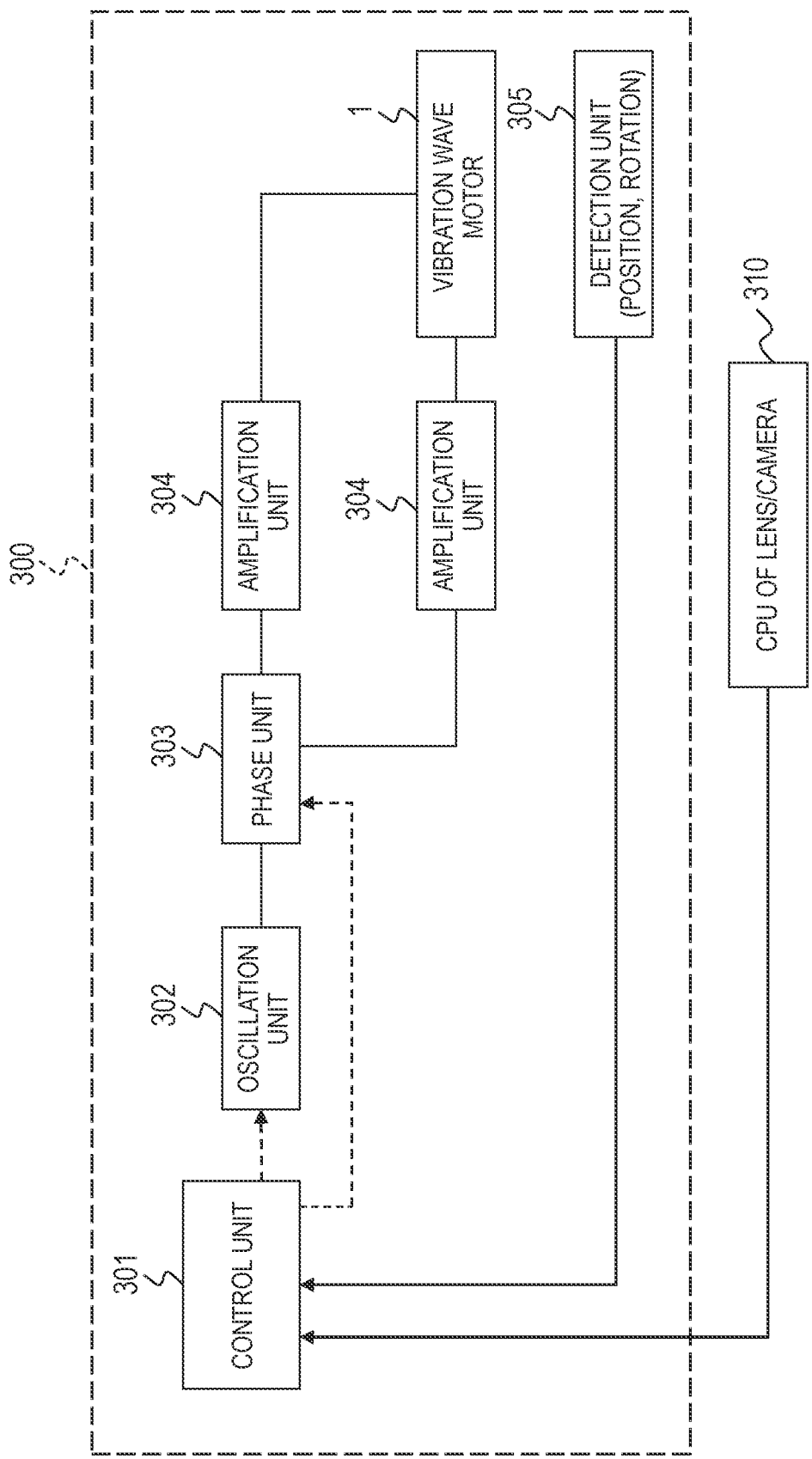
FIG. 3 is a block diagram illustrating a driving device of a vibration wave motor according to embodiment 1.

FIG. 3 is a block diagram illustrating a driving device 300 of a vibration wave motor 1 according to embodiment 1. The driving device 300 includes a control unit 301, an oscillation unit 302, a phase unit 303, an amplification unit 304, the vibration wave motor 1, and a detection unit 305. The control unit 301 is electrically connected with a CPU 310 in a lens barrel 110 (see FIG. 13) or of a camera main body.

The control unit 301 controls driving of the vibration wave motor 1 based on a drive command from the CPU 310 in the lens barrel 110 or of the camera main body. The control unit 301 receives a detection signal from the detection unit 305, obtains position information and speed information based on a value of this detection signal, and controls a frequency of the oscillation unit 302 such that positioning is performed at a target position.

The oscillation unit 302 generates a drive signal of a desired frequency according to a command of the control unit 301. The phase unit 303 divides the drive signal generated by the oscillation unit 302 into two drive signals of different phases. The amplification unit 304 respectively boosts the two drive signals divided by the phase unit 303 to desired voltages. The drive signals from the amplification unit 304 are transmitted to the vibration wave motor 1, the vibrator 10 produces a traveling wave when applied these drive signals, and the mover 20 is driven.

The detection unit 305 includes, for example, an optical encoder or a magnetic encoder, and detects a position and a speed of a driving object driven by driving of the mover 20, and transmits a detection value as an electric signal to the control unit 301.

Next, an operation of the vibration wave motor 1 will be described. When the control unit 301 issues the drive command, the oscillation unit 302 generates a drive signal. This drive signal is divided into two drive signals whose phases are different by 90 degrees by the phase unit 303, and is amplified to desired voltages by the amplification unit 304. The amplified drive signals are applied to the piezoelectric body 11 of the vibration wave motor 1, and the piezoelectric body 11 is excited (vibrated). When the piezoelectric body 11 is excited, the elastic body 12 causes quaternary bending vibration. The piezoelectric body 11 is grouped into the A phase and the B phase, and the drive signals are respectively applied to the A phase and the B phase.

Positional phases of quaternary bending vibration caused by the A phase and quaternary bending vibration caused by the B phase are shifted by a ¼ wavelength. Furthermore, phases of an A phase drive signal and a B phase drive signal are shifted by 90 degrees, and therefore the two bending vibrations are synthesized, and become traveling waves of four waves.

An elliptical motion occurs at a crest of a traveling wave. Thus, the mover 20 placed in pressure contact with the driving surface 12a is driven causing friction by this elliptical motion. The optical encoder which is the detection unit 305 is arranged on a driving body driven by driving of the mover 20, and the optical encoder generates an electric pulse to transmit to the control unit 301. The control unit 301 can obtain a current position and a current speed based on a signal of this electric pulse.

<Piezoelectric Body 11>

Figure 4:
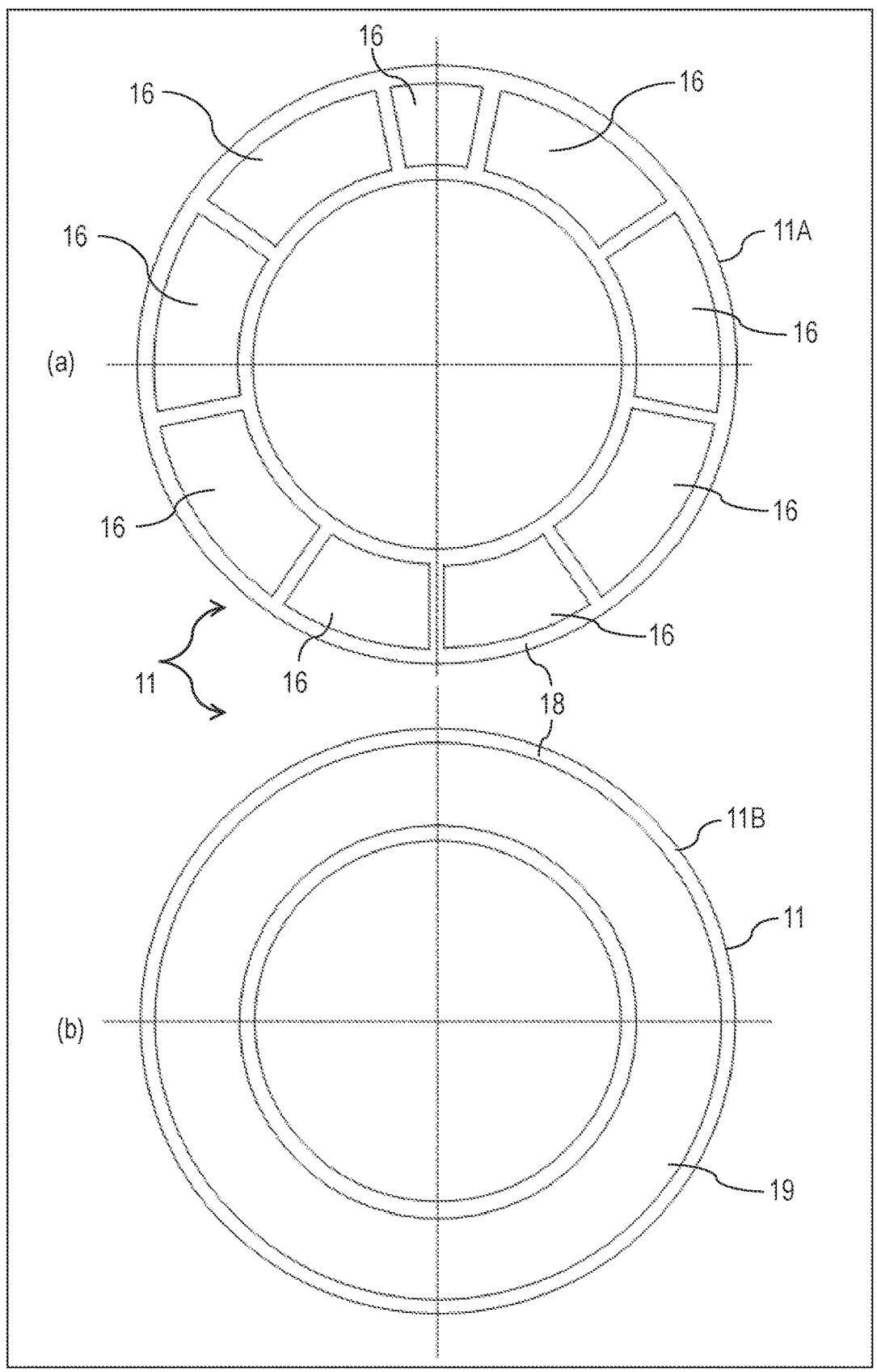
FIG. 4 is an explanatory view illustrating the piezoelectric body according to embodiment 1.
Figure 5:
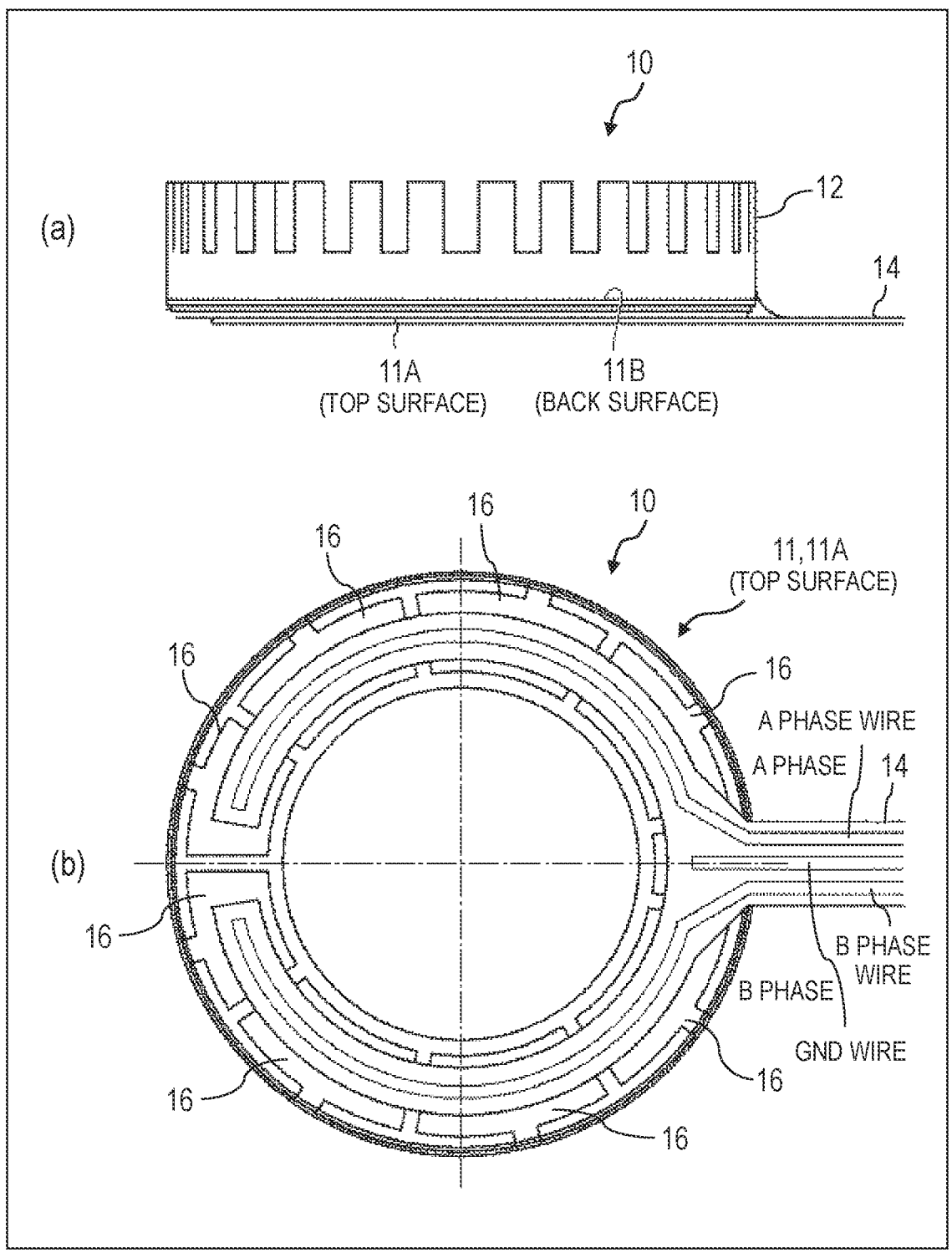
FIG. 5 is an explanatory view illustrating the vibrator according to embodiment 1.

FIG. 4 is an explanatory view illustrating the piezoelectric body 11 according to embodiment 1. FIG. 4(a) is a view illustrating a top surface 11A of the piezoelectric body 11, and FIG. 4(b) is a view illustrating a back surface 11B of the piezoelectric body 11. FIG. 5 is an explanatory view illustrating the vibrator 10 according to embodiment 1. FIG. 5(a) is a view illustrating a side surface of the vibrator 10, and FIG. 5(b) is a view illustrating the vibrator 10 seen from a side of the top surface 11A of the piezoelectric body 11.

In the top surface 11A, electrodes 16 are grouped into two phases (the A phase and the B phase) along the circumferential direction. In each phase, the electrodes 16 are alternately polarized per ½ wavelength, and the electrodes 16 are printed on a base 18 of the piezoelectric body 11 by a silver paste such that an interval corresponding to a ¼ wavelength is secured between the A phase and the B phase. The electrodes 16 may be metal plating such as NiP or gold. The base 18 of the piezoelectric body 11 is formed by a lead-free material whose main ingredients are sodium-potassium niobate.

The back surface 11B has a shape on which an electrode 19 which is not like an electrode pattern of the electrodes 16 is printed by a silver paste, and in which the base 18 of the piezoelectric body 11 appears at an outer circumferential side and an inner circumferential side. The electrode 19 may be metal plating such as NiP or gold. The back surface 11B is bonded to the elastic body 12 by a cold curing adhesive.

Furthermore, the FPC 14 is bonded to the top surface 11A to transmit drive signals from the driving device 300, and is connected with the driving device 300. A GND wire of the FPC 14 is bonded to the electrodes 16 of the ¼ wavelength, is bonded to the electrodes 16 of the ¼ wavelength and a metal part of the elastic body 12 crossing using an unillustrated conductive coating, and thereby is grounded to the metal part of the elastic body 12.

Hereinafter, a material of the piezoelectric body 11 will be described. The material of the piezoelectric body 11 is a piezoelectric ceramic made of sodium-potassium niobate metal oxides, and a following material and manufacturing method are used, for example. The material of the piezoelectric body 11 is expressed by following chemical formula (1).

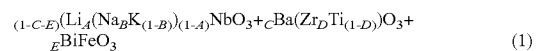

$$(1-C-E)(Li_A(Na_BK_{(1-B)})_{(1-A)}NbO_3 + {}_CBa(Zr_DTi_{(1-D)})O_3 + {}_EBiFeO_3 \quad (1)$$

where $0<A<0.2$, $0.4\leq B\leq 0.6$, $0<C\leq 0.1$, $0<D<1.00$, and $0<E<0.02$ hold The material of this piezoelectric body 11 has a very little temperature characteristics of a relative permittivity. More specifically, a change percentage of the relative permittivity is 500 [ppm/° C.] or less in absolute value in a range of −40° C. to 170° C., that is, is in a range of −500 to +500 [ppm/° C.]. Consequently, it is possible to make the temperature characteristics of an electrostatic capacitance of the piezoelectric body 11 a little very much.

Use of sodium carbonate and potassium carbonate in the material makes pH of a slurry at a time of mixing and at a time of pulverization strong alkaline. Hence, according to the present embodiment, sodium niobate and potassium niobate which are prepared by a hydrothermal synthesis method and whose grain sizes are nano sizes are used for the material. Consequently, it is possible to make pH weak alkaline.

Furthermore, sodium and niobium, and potassium and niobium of sodium niobate and potassium niobate whose composition ratios (x) are in a range of 1.00×1.01 may be used. According to a manufacturing method described below, the range of (x) was changed to check a difference between a case where (x) was 1.00 and a case where (x) was 1.01.

The manufacturing method will be more specifically described below. A and B were respectively changed in a following range based on chemical formula $_{(1-C-E)}(Li_A(Na_BK_{(1-B)})_{(1-A)}NbO_3$ as a composition of a niobium non-lead piezoelectric ceramic material to carry out the manufacturing method.

$$0.055 \leq A \leq 0.1$$

$$0.4 \leq B \leq 0.6$$

Barium zirconate titanate and bismuth ferrite were added thereto to prepare the composition.

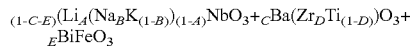

(0.055≤A≤0.1, 0.4≤B≤0.6, 0.05≤C≤0.1, 0.17≤D≤0.83, and 0.005≤E≤0.01)

According to a blending method according to the present embodiment, 0.055 mol to 0.1 mol of lithium carbonate, 0.05 mol to 0.1 mol of barium carbonate, 0.05 mol to 0.1 mol of zirconium oxide, 0.05 mol to 0.1 mol of titanium oxide, 0.005 mol to 0.01 mol of bismuth oxide, and 0.005 mol to 0.01 mol of iron oxide were blended at this rate.

Furthermore, a blending amount of a composition of a material α in FIG. 6 which was blended such that an entire blending amount was in a scale of 100 g, and a preparation method thereof will be described as a typical example.

FIG. 6 is a table illustrating constants (A to E), an electromechanical coupling factor, a relative permittivity, a piezoelectric constant, and temperature characteristics of the relative permittivity (change percentage) of chemical formula (1) of each material. The temperature characteristics of the relative permittivity were measured in two temperature ranges (−40 to 170° C. and 0 to 60° C.). When the electromechanical coupling factor is larger, electric energy is more efficiently converted into mechanical energy. In addition to these ingredients, 0.1 wt % of Cu was added to a material γ. Thus, a mechanical quality factor (described later with reference to FIG. 11) improves.

According to the blending amount of the composition of the material α in FIG. 6 and the preparation method thereof, 0.057 mol of lithium carbonate, 0.05 mol of barium carbonate, 0.0415 mol of zirconium oxide, 0.0085 mol of titanium oxide, 0.005 mol of bismuth oxide, and 0.005 mol of iron oxide were blended at this rate, and were mixed and milled in 300 ml of water for 24 hours by a ball mill to prepare a primary mixing and milling solution. Furthermore, compared to the blending amount of the composition of the material α in FIG. 6, blending amounts of compositions of A to E in other Nos. are determined based on varying percentage proportions with respect to the material α.

0.444 mol of sodium niobate and 0.444 mol of potassium niobate prepared by the hydrothermal synthesis method by being subjected to solvothermal reaction with this primary mixing and milling solution at 150° C. to 300° C. for 1 to 12 hours was blended to prepare a mixture. This mixture was mixed and milled in 300 ml of water at a room temperature for 24 hours by the ball mill again to prepare a secondary mixing and milling solution. Subsequently, this secondary mixing and milling solution was dried at 85° C. for 48 hours in a state where the secondary mixing and milling solution was weak alkaline at pH 8.9 to pH 9.8 equal to or less than pH 10 to prepare a dried material.

Next, this dried material was subjected to temporary calcination twice in a range of 700° C. to 800° C. The first temporary calcination was performed at 800° C. for two hours by using an electric furnace, resulting temporary calcination powder was then milled in 300 ml of water for 24 hours by the ball mill, was dried at 85° C. for 48 hours by using a thermostat bath, and, after primary temporary calcination milled dried powder was prepared, temporary calcination was performed again.

A temperature range of second temporary calcination was 800° C. which was the same temperature condition as that of the first temporary calcination, and the time was two hours. In this regard, the first temporary calcination and the second temporary calcination may be performed under a condition that calcination temperatures are different. Although a calcination atmosphere condition was that calcination was performed in atmospheric air in the present embodiment, calcination can be also performed in an atmosphere other than air. For example, manufacturing can be performed in an oxygen atmosphere.

A temporary calcination powder milling method was a method such as a ball mill or a bead mill, and second calcination powder was milled in 300 ml of water for 24 hours by the ball mill such that a grain size of second temporary calcination milled dried powder became 1 μm or less, and was dried at 85° C. for 48 hours by using the thermostat bath to prepare second temporary calcination milled dried powder.

Subsequently, the second temporary calcination milled dried powder and 10 wt % of a binder were mixed, were let pass a #40 mesh screen, and were dried at 110° C. for one hour by using the thermostat bath to prepare granulated powder of granules.

After granulation, the granulated powder was loaded to a mold of φ15 mm, was pressurized by using a hydraulic press machine (200 ton press), and was molded such that a molding density (ρ) was approximately 2.3 g/cm³ to 2.6 g/cm³ and the thickness of a molded material was 1.5 mm. A time for pressurization was 1 to 10 seconds. Note that the molding density (ρ) was approximately 2.3 to 2.6 g/cm³, and molding was performed by changing the molding density in a range of 2.6 g/cm³ which was an upper limit to 2.3 g/cm³ which was a lower limit. A result of molding showed that 2.5 g/cm³ was optimal.

Although degreasing is performed in a temperature range of 700° C. to 800° C. by using the electric furnace after molding, it is preferable to maintain the temperature range at 700° C. for four hours, and then perform calcination in a calcination temperature range of 1100° C. to 1250° C. in the embodiment. Calcination was performed at 1200° C. in the embodiment. Calcination was performed in an atmosphere such as air at a time of calcination.

After calcination, a calcined material was machined to a thickness of T=0.5 mm by using a grinding machine (6 BN, HAMAI and number #800 abrasive), and a silver paste (SR-2099 made by Namics Corporation) was applied to a surface of a machined element by a screen printing method to provide the element with silver electrodes at 800° C. by using the electric furnace. This element with the silver electrodes was applied a voltage of 4.0 kV/mm in an insulating oil (silicon oil) of 50° C. for 10 minutes, and polarized to manufacture a niobium non-lead piezoelectric ceramic.

Furthermore, according to a method for measuring a niobium non-lead piezoelectric ceramic material, the niobium non-lead piezoelectric ceramic material was left for 24 hours after polarization processing, and measured by a resonance-antiresonance method by using an impedance analyzer (device 4294A manufactured by Agilent Technologies, Inc.). Furthermore, an equivalent piezoelectric constant was measured by using a $d_{33}$ meter (ZJ-43 manufactured by Institute of Acoustics, Chinese Academy of Sciences).

The niobium non-lead piezoelectric ceramic according to the present embodiment was obtained by this manufacturing method. The electromechanical coupling factor, the relative permittivity, the piezoelectric constant, the temperature characteristics of the relative permittivity and temperature characteristics of a Curie point of the resulting niobium non-lead piezoelectric ceramic were measured by a following method.

<Measurement Device and Measurement Method>

A method for measuring the temperature characteristics of the relative permittivity of the niobium non-lead piezoelectric ceramic material prepared by the manufacturing method according to the present embodiment will be described.

The piezoelectric body 11 having a shape whose diameter was φ10×T0.5 mm and obtained herein was left for 24 hours, a small ultra-low incubator (MC-811, ESPEC CORP.) was used, and an electrostatic capacitance at a time when a frequency was 1 kHz and a voltage was 0.5 V was measured by using the impedance analyzer (device 4294A manufactured by Agilent Technologies, Inc.) every 10° C. from −40° C. to 170° C. and from 170° C. to −40° C. to calculate the relative permittivity. A result thereof is shown in FIG. 7.

Figure 7:
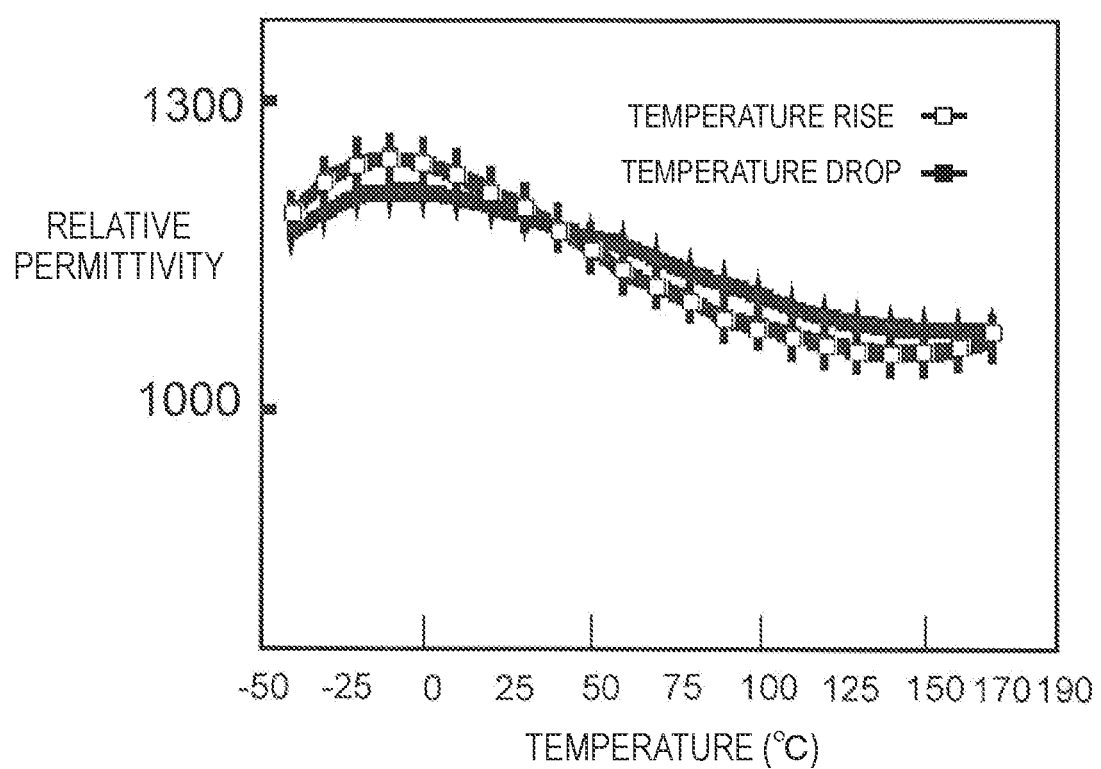
FIG. 7 is a view of temperature characteristics of a relative permittivity.

FIG. 7 is a view of temperature characteristics of a relative permittivity. FIG. 7 illustrates a change in the relative permittivity at a time when measurement was performed by raising a temperature in a temperature range from −40° C. to 170° C. and dropping a temperature from 170° C. to −40° C. to the contrary. A difference between values of the relative permittivity according to the present embodiment at the time of the temperature rise when measurement was performed from the low temperature side of −40° C. and at the time of the temperature drop from when measurement was performed from the high temperature side of 170° C. was maximum 38 and small, and a hysteresis value of the relative permittivity before and after phase transition was in a range of 32 to 38.

It is generally known that, in a case of a material such as crystal, a relative permittivity changes little in a temperature range of −40° C. to 170° C. Even according to the present embodiment, it has been confirmed that a material having sufficient practicality can be provided in this range as shown in FIG. 7.

<Temperature Characteristics of Electrostatic Capacitance of Piezoelectric Body 11>

Figure 8B:
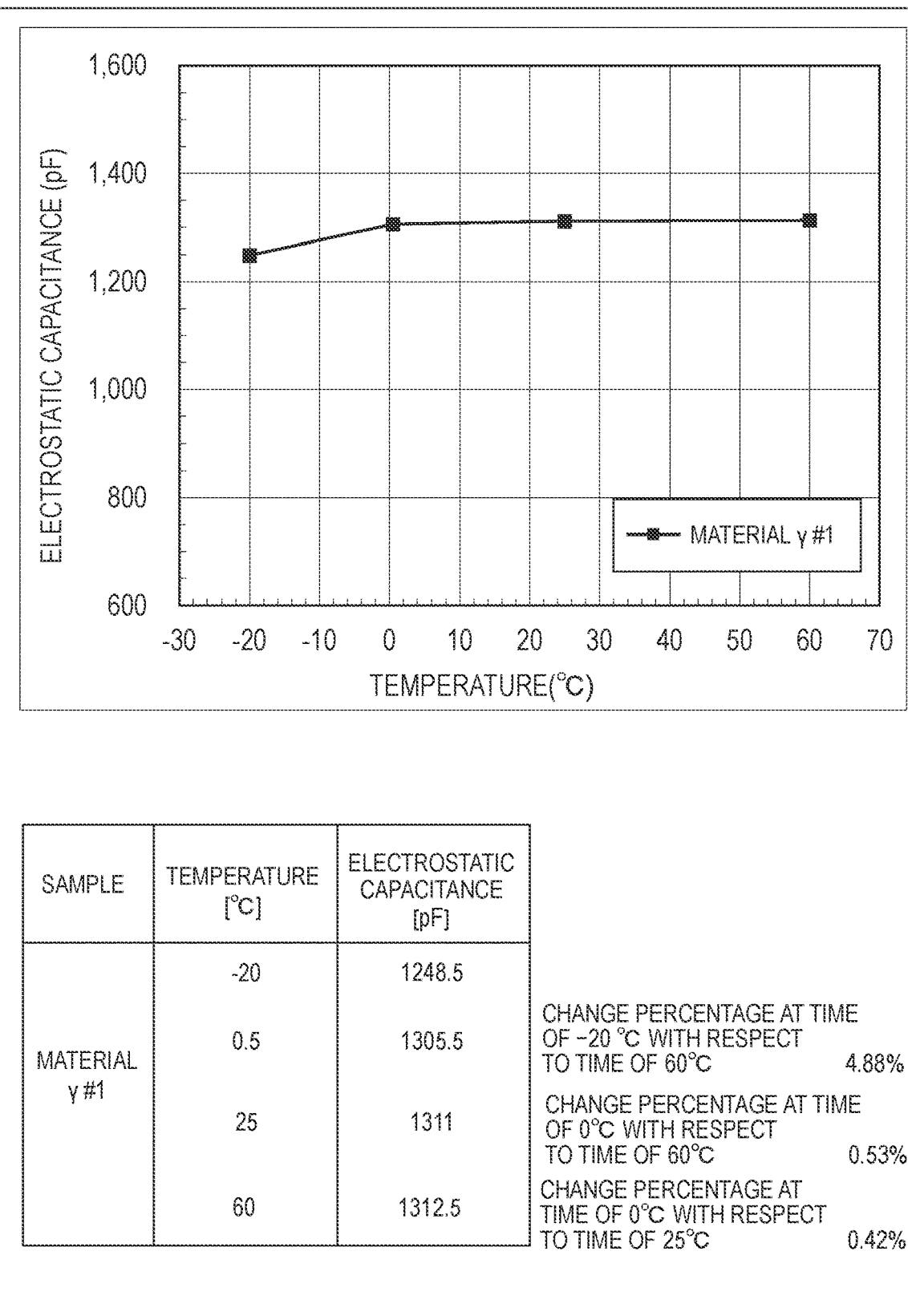
FIG. 8B is a graph illustrating temperature characteristics of an electrostatic capacitance of the material γ of the piezoelectric body 11 according to embodiment 1.

FIG. 8A1 is a graph illustrating temperature characteristics of electrostatic capacitances of materials α and β of the piezoelectric body 11 according to embodiment 1 (part 1). FIG. 8A2 is a graph illustrating temperature characteristics of electrostatic capacitances of materials α and β of the piezoelectric body 11 according to embodiment 1 (part 2). FIG. 8B is a graph illustrating temperature characteristics of an electrostatic capacitance of the material γ of the piezoelectric body 11 according to embodiment 1. In FIGS. 8A and 8B, for example, a temperature higher than −20° C. and equal to or less than 0° C. is a low temperature range, a temperature higher than 0° C. and equal to or less than 25° C. is a normal temperature range, and a temperature higher than 25° C. and equal to or less than 60° C. is a high temperature range. Regarding changes in the electrostatic capacitances of the materials α, β, and γ from the time of the low temperature to the time of the high temperature, in a case where 60° C. serves as a reference point, fluctuation of the material α is approximately 2% at 0° C., and approximately 10% at −20° C. Fluctuation of the material β is approximately 4% at 0° C., and approximately 11% at −20° C. Fluctuation of the material γ is approximately 1% at 0° C., and approximately 5% at −20° C.

<Temperature Characteristics of Electrostatic Capacitance of Vibrator 10>

Figure 9B:
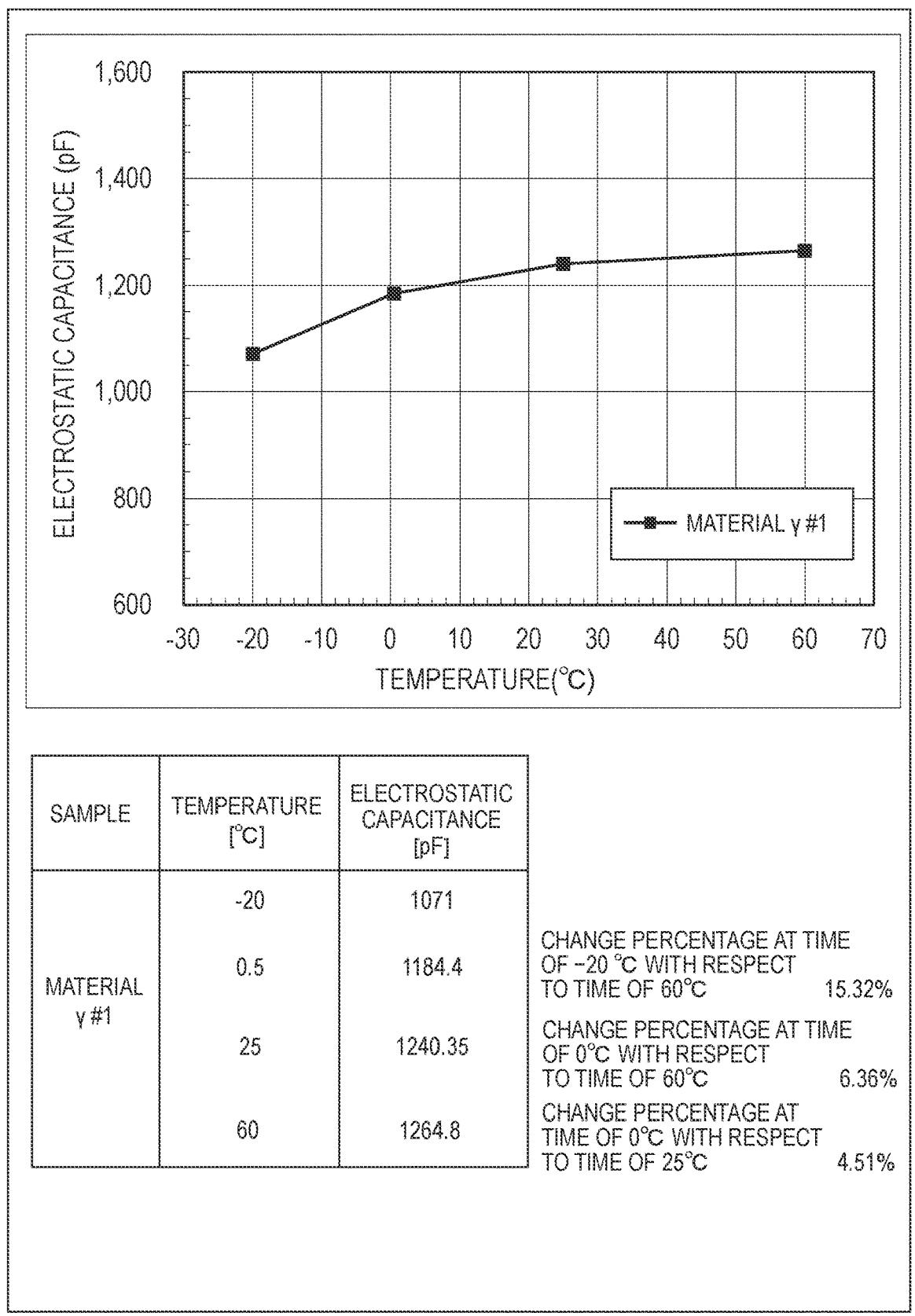
FIG. 9B is a graph illustrating temperature characteristics of an electrostatic capacitance of the vibrator 10 according to embodiment 1 in a case where the material γ is used.

FIG. 9A1 is a graph illustrating temperature characteristics of electrostatic capacitances of the vibrator 10 in a case where the materials α and β are used (part 1). FIG. 9A2 is a graph illustrating temperature characteristics of electrostatic capacitances of the vibrator 10 in a case where the materials α and β are used (part 2). FIG. 9B is a graph illustrating temperature characteristics of an electrostatic capacitance of the vibrator 10 according to embodiment 1 in a case where the material γ is used. Regarding changes in the electrostatic capacitances of the vibrator 10 from the time of the low temperature to the time of the high temperature, in a case where 60° C. serves as a reference point, fluctuation of the material α is approximately 8% at 0° C., and approximately 18% at −20° C. Fluctuation of the material β is approximately 10% at 0° C., and approximately 20% at −20° C. Fluctuation of the material γ is approximately 6% at 0° C., and approximately 16% at −20° C. These fluctuations are much smaller than 25% at 0° C. and 31 to 33% at −20° C. which are change percentages in a case where PZT is mounted.

<Consumption Current Measurement>

Figure 10A:
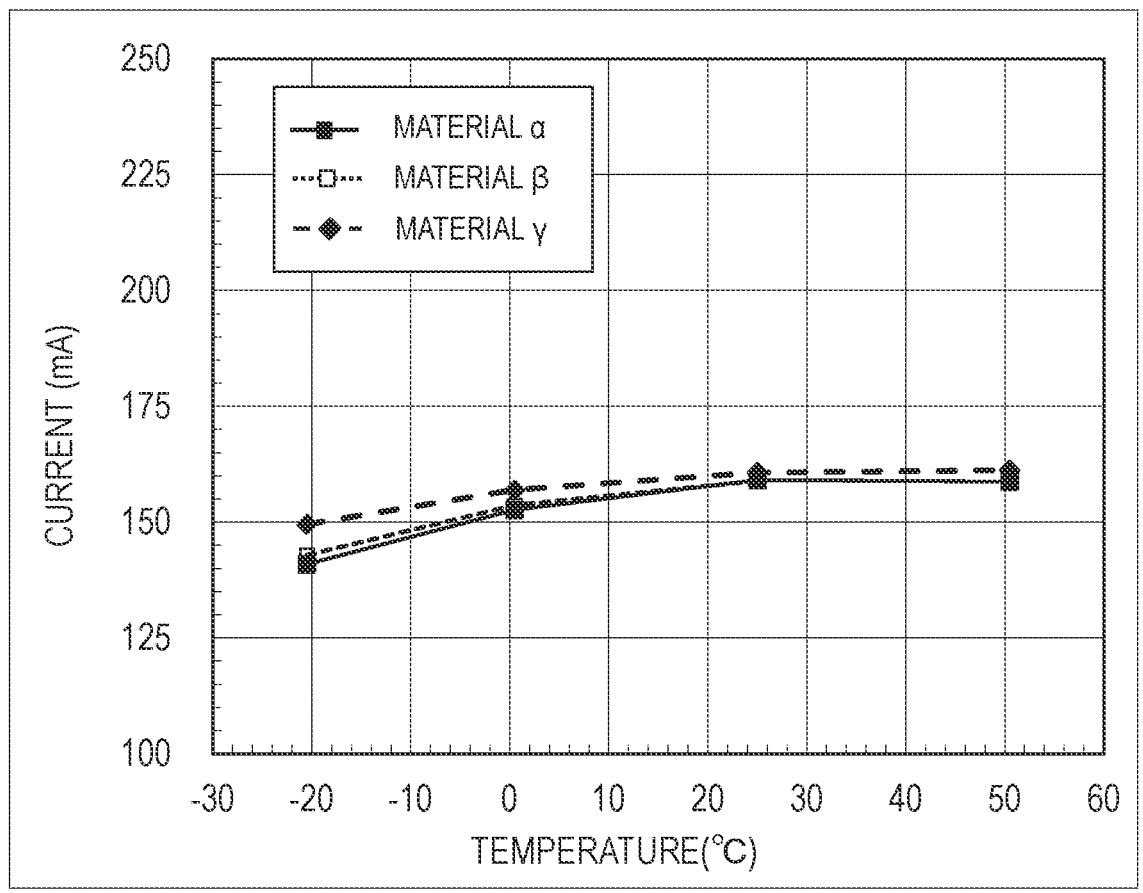
FIG. 10A is a graph illustrating a measured consumption current at each temperature for the vibration wave motor according to embodiment 1 and a vibration wave motor which is a PZT-mounted product (part 1).

FIG. 10A is a graph illustrating a measured consumption current at each temperature for the vibration wave motor 1 according to embodiment 1 and a vibration wave motor which is a PZT-mounted product (part 1). FIG. 10B is a graph illustrating a measured consumption current at each temperature for the vibration wave motor 1 according to embodiment 1 and a vibration wave motor which is a PZT-mounted product (part 2). A drive voltage was set to 70 [Vrms] per measurement to measure a current input to the vibration wave motor at a time when the vibration wave motor was driven at a predetermined rotation speed. It is found that the vibration wave motor 1 on which the materials α, β, and γ are mounted has little temperature characteristics of the input current. Upon comparison with the temperature characteristics of the input current of the PZT-mounted product illustrated in FIGS. 19A and 19B, it is found that the vibration wave motor 1 can be more efficiently driven than the PZT-mounted product particularly at a high temperature. This phenomenon is caused by the temperature characteristics of the electrostatic capacitance of the vibrator 10 as described above. This phenomenon will be described with reference to FIG. 11.

Figure 11:
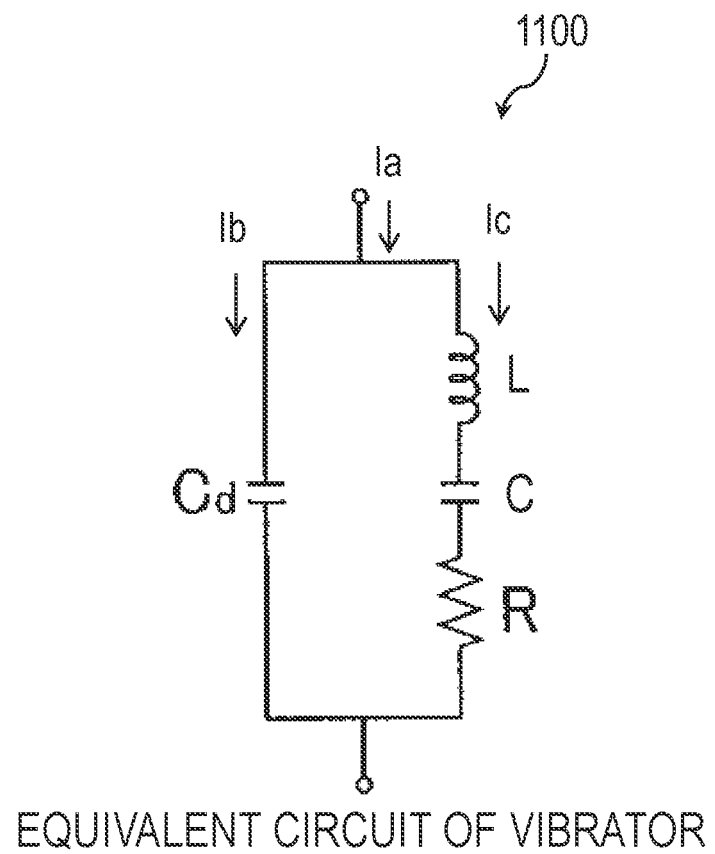
FIG. 11 is an explanatory view illustrating an equivalent circuit of the vibrator of the vibration wave motor.

FIG. 11 is an explanatory view illustrating an equivalent circuit of the vibrator 10 of the vibration wave motor 1. An equivalent circuit 1100 of the vibrator 10 includes an electrostatic capacitance Cd of the piezoelectric body 11, an equivalent inductance L, an equivalent capacitance C, and a resonant resistance R. A current Ia of the vibrator 10 is a sum of a current Ib (following equation (2)) to a component of the electrostatic capacitance Cd of the piezoelectric body 11 and a current Ic (following equation (3)) to an LCR series side.

$$Ib = E/(1/j\omega Cd) \qquad (2)$$

where E represents a drive voltage, ω represents an angular frequency, and f represents a frequency of a drive signal.

$$Ic = \frac{E}{R + j(\omega L + 1/\omega C)} \qquad (3)$$

where Ia≈Ib holds in state of 1/jωCd<<R+j(ωL+1/ωC).

Generally, a vibration wave motor is driven at a driving frequency which is slightly apart toward a high frequency side from a resonance frequency at which an impedance of an equivalent circuit 900 is minimum and an antiresonance frequency at which the impedance of the equivalent circuit 900 is maximal. Under a condition of this driving frequency, a value of 1/ωCd which is a denominator of the current Ib is much smaller than a value of R+(ωL−1/ωC) which is a denominator of the current Ic, and therefore the current Ia input to the vibrator 10 takes the substantially same value as that of the current Ib. That is, a consumption current of the vibrator 10 substantially depends on whether the value of the electrostatic capacitance Cd of the piezoelectric body 11 is large or small.

Hence, when the electrostatic capacitance of the vibrator 10 changes due to a temperature, an impedance also changes, and a current to be input changes. The electrostatic capacitance of the products on which the materials α, β, and γ are mounted increases little even when a temperature becomes high, and therefore a current to be input also increases little.

Furthermore, a general vibration wave motor is designed to match an impedance of a driving device and an impedance of a vibration wave motor. Hence, when the value of the electrostatic capacitance Cd of the piezoelectric body 11 changes, a voltage of a drive signal (drive voltage E) changes. Therefore, when the electrostatic capacitance Cd of the piezoelectric body 11 is fluctuated by an environmental temperature, the voltage of the drive signal also fluctuates.

Even when the vibration wave motor on which PZT is mounted adjusts the voltage to an appropriate voltage at a normal temperature, the drive voltage at a low temperature and a drive voltage at a high temperature significantly differ. More specifically, a phenomenon that, compared to the voltage at the time of the normal temperature, the drive voltage is high at the time of the low temperature, and the drive voltage is low at the time of the high temperature occurs. A higher drive voltage than an originally necessary drive voltage is set at the time of the low temperature, and the high voltage undermines driving efficiency of the drive circuit itself. A change in the electrostatic capacitance of the vibration wave motor 1 according to embodiment 1 at the time of the low temperature and at the time of the high temperature is a little compared to the PZT-mounted product, so that it is possible to substantially make fluctuation of the drive voltage a very little, and driving efficiency of the driving device 300 itself is improved.

Q in following equation (4) represents a mechanical quality factor. Values of the equivalent inductance L and the equivalent capacitance C influence resonance characteristics of the vibrator 10. The mechanical quality factor Q is a scale which indicates resonance characteristics, and a higher value of the mechanical quality factor Q indicates better resonance characteristics. The mechanical quality factor Q becomes larger as an Lm value becomes larger. Compared to the material β, the material γ illustrated in FIG. 6 provides the larger mechanical quality factor Q, and improved resonance characteristics.

$$Q = \frac{1}{2\pi fCR} = \frac{2\pi fL}{R} \qquad (4)$$

Furthermore, it is also found that the vibration wave motor 1 according to embodiment 1 has a little temperature characteristics of a drivable voltage.

FIG. 12 is a table showing a lowest voltage (referred to a drivable voltage below) of a drive signal which can drive the vibration wave motor 1 according to embodiment 1. The vibration wave motor 1 cannot be driven at the drive voltage E which is lower than a value of the drivable voltage. In a case of each of the materials α, β, and γ, the drivable voltages change little in a range to 0 to 50° C. in temperature at which the electrostatic capacitances change little. Although the drivable voltages become higher a little at −20° C., fluctuation amounts are a very little compared to a case where the PZT is mounted.

An experiment conducted by the inventors of the present invention shows that the drivable voltage and the electrostatic capacitance of the vibrator 10 correlate. This reason will be described. An electromechanical coupling factor Kvn of the vibrator 10 is expressed by following equation (5) as a quantity converted from electric energy Ui stored in the vibrator 10 into mechanical energy Ut which is strain energy of vibration.

$$Kvn = (Ut/Ui)^{0.5} \qquad (5)$$

Almost all of the electric energy Ui stored in the vibrator 10 is stored in the piezoelectric body 11. On the other hand, energy Pf stored in the piezoelectric body 11 is as expressed by following equation (6).

$$Pf = E \times \omega \times Cdv \qquad (6)$$

E represents a drive voltage, ω represents an angular frequency, and Cdv represents an electrostatic capacitance of the vibrator 10. A state where the vibration wave motor 1 is drivable is a state where strain energy reaches a certain threshold or more. When the electromechanical coupling factor Kvn and w take certain values, the strain energy of the certain threshold depends on a value of the electrostatic capacitance Cdv of the vibrator 10 and a voltage value to be applied. However, it is thought that the electrostatic capacitance Cdv of the vibrator 10 of the PZT-mounted product is fluctuated by a temperature, and therefore a drivable voltage changes accompanying the fluctuation.

When driving is performed using a drive signal of a certain voltage, the drivable voltage at −20° C. at which the drivable voltage becomes high is set as a reference point to set the drive voltage E to the PZT-mounted product. However, a difference between the drive voltages E and the drivable voltages at a normal temperature and a high temperature becomes significant, and therefore an extra current larger than an originally necessary current is input. On the other hand, the temperature characteristics of the drivable voltage of the vibration wave motor 1 according to embodiment 1 are a little, a difference between the drive voltage and the drivable voltage at each temperature does not change so much, and therefore a substantially necessary current is input at each temperature.

<Lens Barrel>

Figure 13:
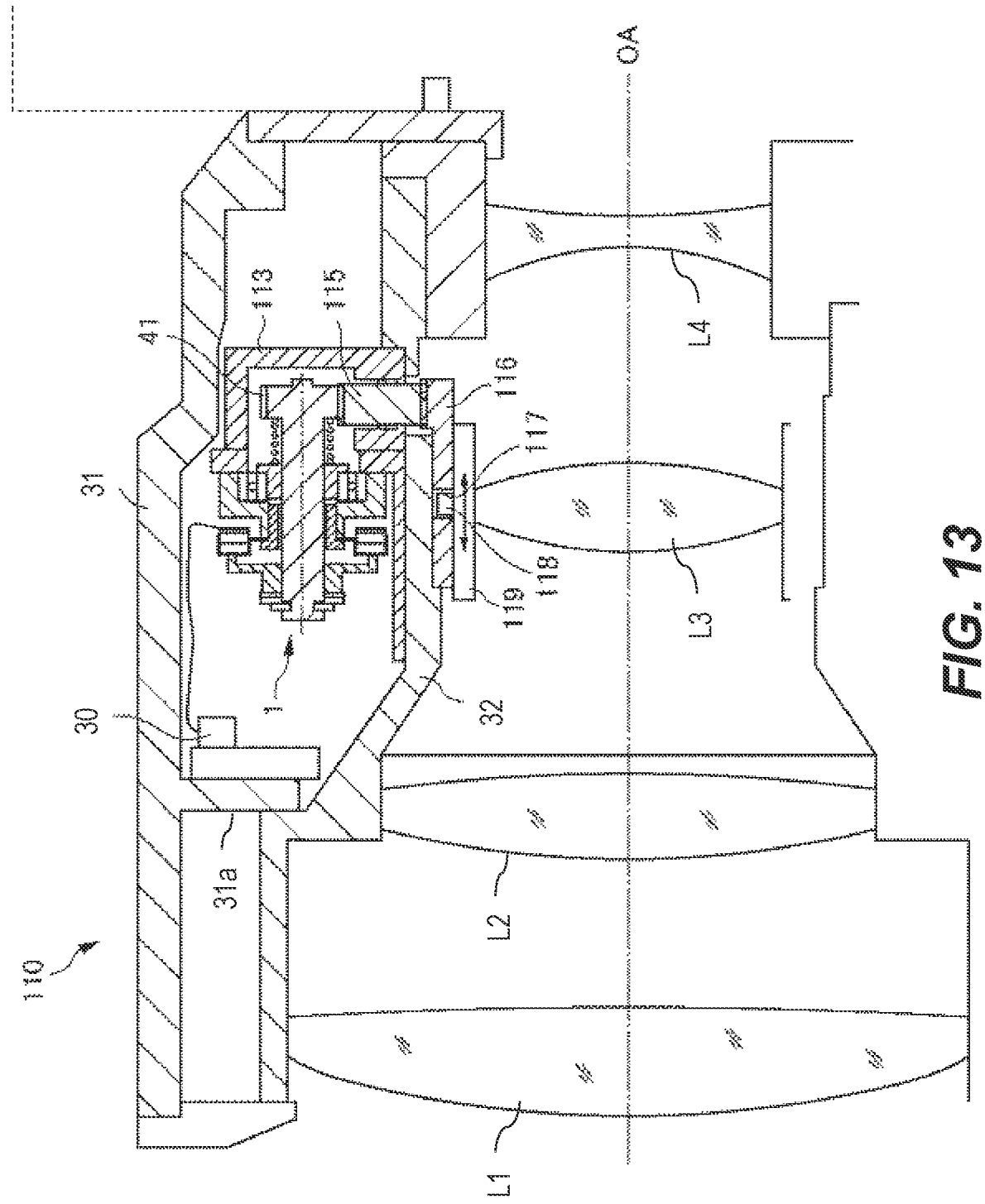
FIG. 13 is a cross-sectional view illustrating a lens barrel on which the vibration wave motor is mounted.

FIG. 13 is a cross-sectional view illustrating a lens barrel 110 on which the vibration wave motor 1 is mounted. The lens barrel 110 includes an outer fixed cylinder 31, an inner fixed cylinder 32, and the vibration wave motor 1. The outer fixed cylinder 31 has, for example, a cylindrical shape, and covers an outer circumferential part of the lens barrel 110. The outer fixed cylinder 31 includes a protrusion piece 31a which protrudes from an inner circumferential surface of the outer fixed cylinder 31 to an optical axis OA. The protrusion piece 31a supports the inner fixed cylinder 32. The inner fixed cylinder 32 has, for example, a cylindrical shape, and is provided on an inner circumferential side compared to the outer fixed cylinder 31. The vibration wave motor 1 is provided between the outer fixed cylinder 31 and the inner fixed cylinder 32.

In the inner fixed cylinder 32, a first lens group L1, a second lens group L2, a third lens group L3, and a fourth lens group L4 are arranged on the identical optical axis OA in order from a subject side. The third lens group L3 is an AF lens held by an annular Auto Focus (AF) ring 119. The first lens group L1, the second lens group L2 and the fourth lens group L4 are fixed to the inner fixed cylinder 32. The third lens group L3 is configured to be able to move in a direction of the optical axis OA (referred to as an optical axis direction below) with respect to the inner fixed cylinder 32 when the AF ring 119 moves.

The vibration wave motor 1 is attached to a gear unit module 113. The gear unit module 113 is attached to the inner fixed cylinder 32 of the lens barrel 110. The output gear 41 of the vibration wave motor 1 transmits a rotational motion to a cum ring 116 via a deceleration gear 115 of the gear unit module 113, and the cum ring 116 is rotated and driven.

A key groove 117 is engraved in the cum ring 116 diagonally in a circumferential direction. The AF ring 119 includes a fixing pin 118. The fixing pin 118 is inserted in the key groove 117. When the cum ring 116 is rotated and driven in a state where the fixing pin 118 is inserted in the key groove 117, the AF ring 119 is driven in a direction straight to the optical axis OA direction, and can stop at a desired position. The driving device 300 illustrated in FIG. 2 is provided between the outer fixed cylinder 31 and the inner fixed cylinder 32 of the lens barrel 110 to drive and control the above-described vibration wave motor 1, and detect a rotational speed.

Consequently, the vibration wave motor 1 according to embodiment 1 can make temperature characteristics of a consumption current a little compared to the PZT-mounted product. Furthermore, the change in the electrostatic capacitance Cdv of the vibrator 10 at the time of the low temperature and at the time of the high temperature is a little compared to the PZT-mounted product, so that it is possible to substantially make fluctuation of the drive voltage E a very little, and the driving efficiency of the driving device 300 itself is improved. Furthermore, the electrostatic capacitance Cdv of the vibrator 10 is fluctuated little by an environmental temperature compared to the PZT-mounted product, so that it is possible to make a temperature change in a drivable voltage of the vibration wave motor 1 a little.

Embodiment 2

Embodiment 2 is an example where the vibration wave motor 1 according to embodiment 1 is an annular type vibration wave motor. The same components as those of embodiment 1 will be assigned the same reference numerals, and description thereof will be omitted.

Figure 14:
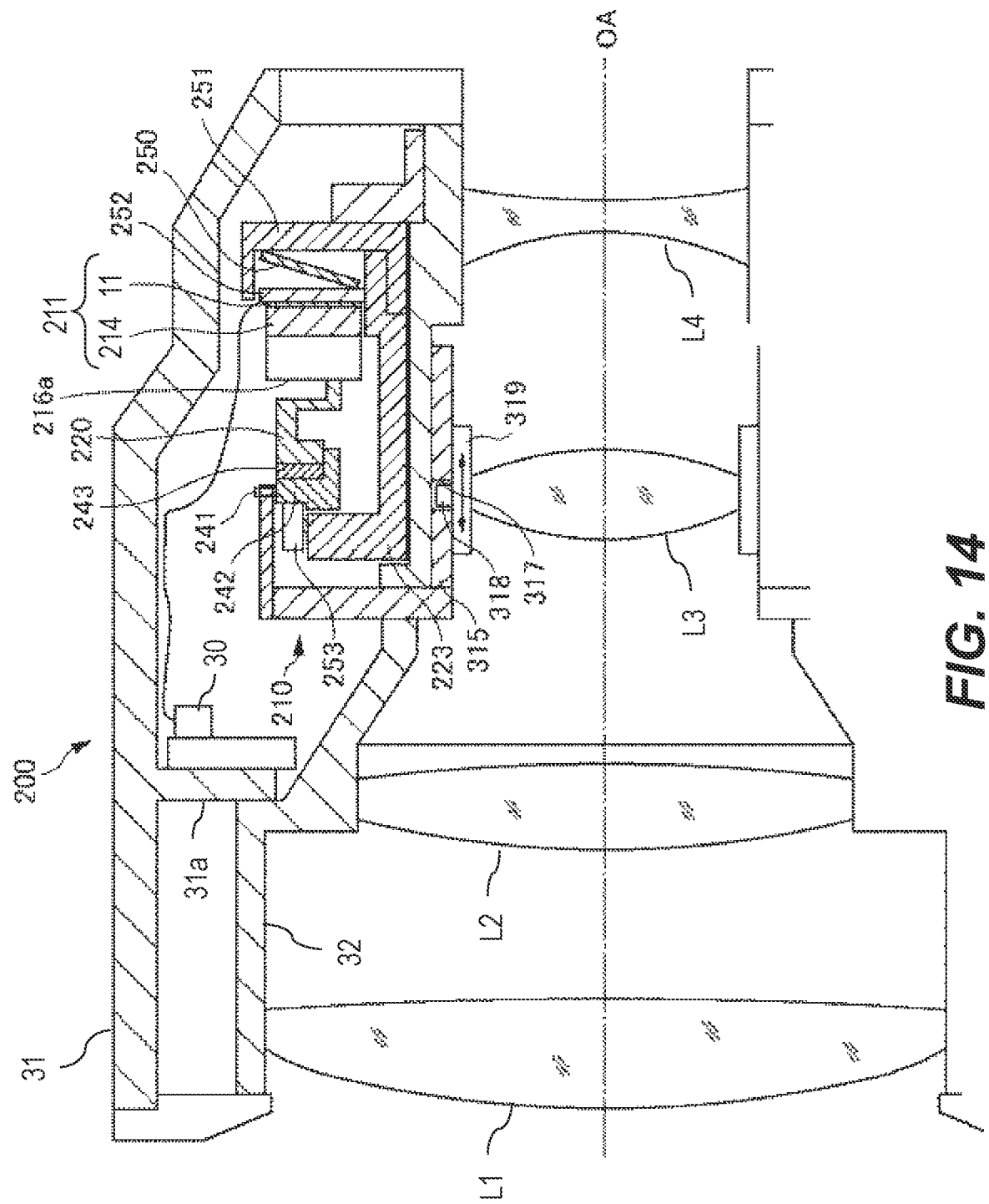
FIG. 14 is a cross-sectional view illustrating a lens barrel on which the annular type vibration wave motor according to embodiment 2 is mounted.

FIG. 14 is a cross-sectional view illustrating a lens barrel on which the annular type vibration wave motor according to embodiment 2 is mounted. A lens barrel 200 includes the outer fixed cylinder 31 and the inner fixed cylinder 32, and adopts a mechanism that a motor unit including an annular type vibration wave motor 210 is fixed to the outer fixed cylinder 31 and the inner fixed cylinder 32. The driving device 300 is provided between the outer fixed cylinder 31 and the inner fixed cylinder 32 of the lens barrel 200 to drive and control the vibration wave motor 210, and detect a rotational speed. The driving device 300 matches an impedance of the driving device 300 and an impedance of the vibration wave motor.

Next, a configuration of the vibration wave motor 210 will be described. The vibrator 211 includes the piezoelectric body 11 which is made of the same sodium-potassium niobate metal oxides as those of embodiment 1, and an elastic body 214 to which the piezoelectric body 11 has been bonded. Although the vibrator 211 produces traveling waves, traveling waves of nine waves will be described as an example in embodiment 2.

The elastic body 214 is made of a metal material whose resonance sharpness is great. The shape of the elastic body 214 is an annular shape. Grooves are engraved on an opposite surface of the elastic body 214 to which the piezoelectric body 11 is bonded. A reason for engraving the grooves is to place the piezoelectric body 11 side close to neutral surfaces of the traveling waves as much as possible, and thereby amplify the amplitudes of the traveling waves of a driving surface 216a. A surface of a part which is not provided with the grooves is the driving surface 216a, and is placed in pressure contact with a mover 220. A lubricant coating film is applied to the surface of the driving surface 216a of the elastic body 214 to secure driving performance and improve durability.

The piezoelectric body 11 is grouped into two phases (the A phase and the B phase) along the circumferential direction similar to embodiment 1, elements are arranged in each phase such that the elements are alternately polarized per ½ wavelength, and an interval corresponding to a ¼ wavelength is secured between the A phase and the B phase. The piezoelectric body 11 is formed by the same material as that of embodiment 1, and is formed by a material whose temperature characteristics of a relative permittivity are a very little, that is, a material whose temperature characteristics of the electrostatic capacitance Cd are a little.

Under the piezoelectric body 11, a non-woven fabric 252 and a pressurizing member 250 are arranged. The non-woven fabric 252 is, for example, a felt, and is arranged under the piezoelectric body 11 to prevent vibration of the vibrator 211 from transmitting to the pressurizing member 250.

The pressurizing member 250 is arranged under a pressure plate (not illustrated) to generate a pressurizing force. In embodiment 2, the pressurizing member 250 is a disc spring. The pressurizing member 250 may be a coil spring or a wave spring instead of the disc spring. A retention ring 251 is fixed to a fixing member 223, and thereby the pressurizing member 250 is held.

The mover 220 is made of a light metal such as aluminum, and a sliding material is provided on a surface of a sliding surface to improve abrasion resistance. A vibration absorption member 243 such as a rubber is arranged on the mover 220 to absorb longitudinal vibration of the mover 220, and an output transmission member 242 is arranged thereon.

A pressurizing direction and a radial direction of the output transmission member 242 are regulated by a bearing 253 provided to the fixing member 223, and thereby a pressurizing direction and a radial direction of the mover 220 are regulated. The output transmission member 242 includes a protrusion part 241, the protrusion part 241 fits with a fork connected with a cum ring 315, and the cum ring 315 rotates together with rotation of the output transmission member 242.

A key groove 317 is engraved in the cum ring 315 diagonally in the circumferential direction, a fixing pin 318 provided to an AF ring 319 fits to the key groove 317, and, when the cum ring 315 is rotated and driven, the AF ring 319 is driven in the direction straight to the optical axis direction, and can stop at a desired position.

The retention ring 251 is attached to the fixing member 223 by a screw, and, by attaching this retention ring 251, the output transmission member 242 to the mover 220, the vibrator 211 and the pressurizing member 250 can be formed as one motor unit.

What is the same as embodiment 1 is that the vibration wave motor 210 which uses the vibrator 211 according to embodiment 2 also has a very little temperature characteristics of the consumption current compared to the PZT-mounted product. Furthermore, the impedance of the driving device 300 and the impedance of the vibration wave motor 210 are matched. A change in the electrostatic capacitance Cdv of the vibrator 10 of the vibration wave motor 210 according to embodiment 2 at the time of the low temperature and at the time of the high temperature is a little compared to the PZT-mounted product, so that it is possible to substantially make fluctuation of the drive voltage E a very little, and driving efficiency of the driving device 300 itself is improved. Furthermore, what is the same as embodiment 1 is that the electrostatic capacitance Cdv of the vibrator 10 is fluctuated little by an environmental temperature, and therefore a temperature change in a drivable voltage of the vibration wave motor 210 is also a little.

Embodiment 3

A vibration wave motor according to embodiment 3 is a type whose vibrator includes only the piezoelectric body 11, and whose driving rail which is a relative motion member is linearly driven. The same components as those of embodiment 1 and embodiment 2 will be assigned the same reference numerals, and description thereof will be omitted.

Figure 15:
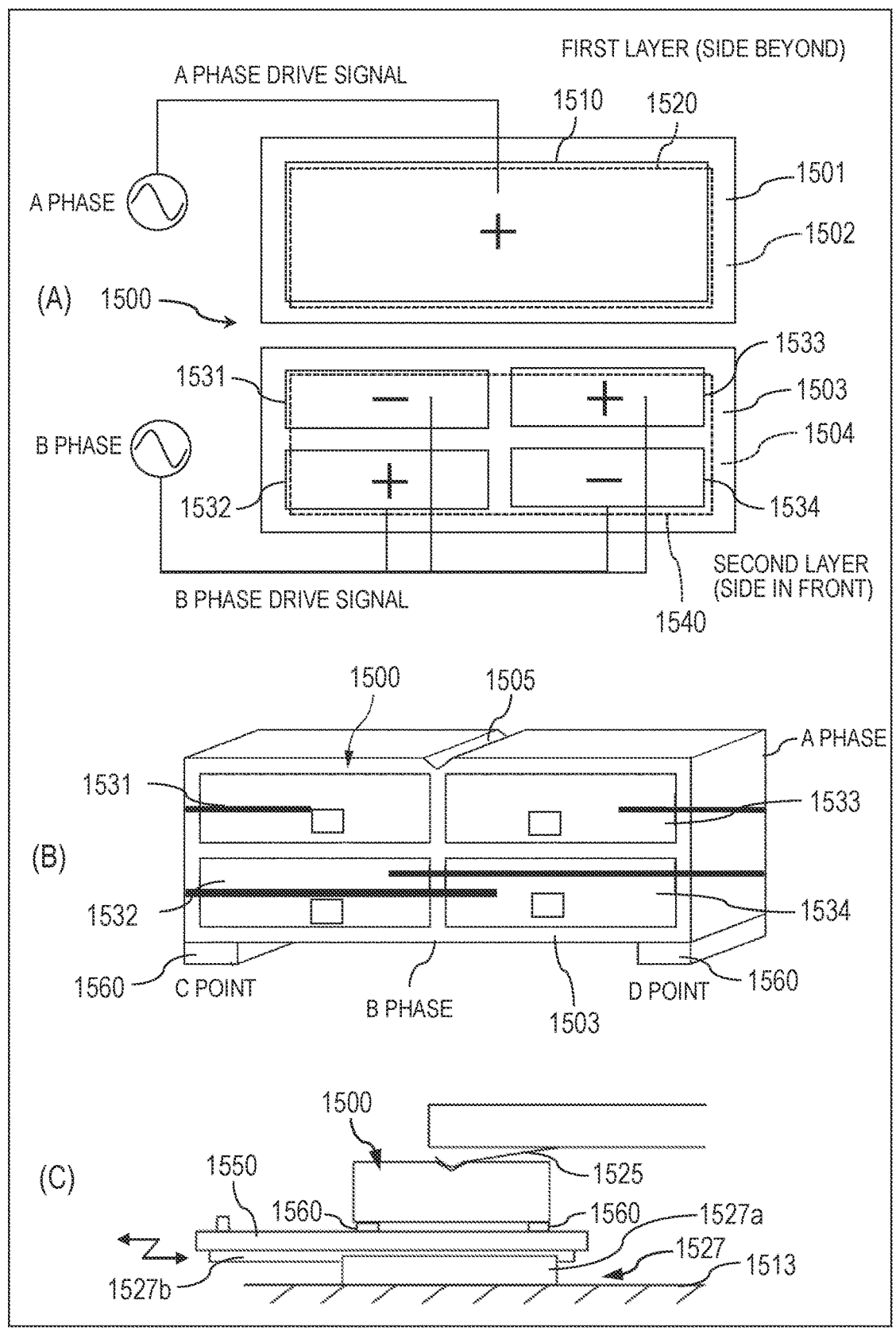
FIG. 15 is an explanatory view illustrating the vibrator according to embodiment 3.

FIG. 15 is an explanatory view illustrating the vibrator according to embodiment 3. FIG. 15(A) is a front view and a back view of a vibrator 1500, FIG. 15(B) is a schematic perspective view of the vibrator 1500, and FIG. 15(C) is an explanatory view illustrating an implementation example of the vibrator 1500.

The vibration wave motor 1 according to embodiment 3 is a type whose vibrator 1500 includes only the piezoelectric body 11, and whose driving rail 1550 which is a relative motion member is linearly driven. The vibrator 1500 includes the piezoelectric body 11 made of the same sodium-potassium niobate metal oxides as those of embodiment 1, and sliding members 1560 which are installed at end parts.

The vibrator 1500 is pressurized against the driving rail 1550 by a pressurizing spring 1525. A linear guide 1527 is provided between a fixing member 1513 and the driving rail 1550, a linear guide fixing part 1527a is fixed to the fixing member 1513, a movable part 1527b is coupled to the driving rail 1550, and the driving rail 1550 can be moved only in left and right directions in the figure. An elliptical motion is produced at positions of sliding members 1560 of the vibrator 1500 to linearly drive the driving rail 1550.

The vibrator 1500 adopts a two-layer structure, one electrode 1510 is provided on a first surface 1501 in a first layer, and one electrode 1520 having the same shape is provided on a second surface 1502 on an opposite side, too. An A phase drive signal is input to the electrode 1510 on the first surface 1501 side, and the electrode 1520 of the second surface 1502 is a GND. In response to the input of the A phase drive signal, the vibrator 1500 produces a standing wave of longitudinal primary mode vibration.

Four divided electrodes 1531 to 1534 are provided on a third surface 1503 in the second layer, and polarization directions of the four electrodes 1531 to 1534 are respectively alternate. One electrode 1540 having the same shape as that of the first layer is provided on a fourth surface 1504 on an opposite side, too. A B phase drive signal is input to the electrodes 1531 to 1534 on the third surface 1503 side, and the electrode 1540 on the fourth surface 1504 side is a GND. In response to the input of the B phase drive signal, the vibrator 1500 produces a standing wave of bending secondary mode vibration.

As for the first layer and the second layer, the second surface 1502 which is the GND in the first layer and the fourth surface 1504 which is the GND in the second layer are bonded to form a common GND. A groove part 1505 is provided at a center part of the vibrator 1500, and the pressurizing spring 1525 fits this groove to prevent displacement of a pressurizing position, and support the driving rail 1550 in a longitudinal direction.

The sliding members 1560 are made of an engineer plastic material of good abrasion resistance, and are provided at places in the figure which are positions at which an amplitude of the standing wave of the longitudinal primary mode vibration maximizes and an amplitude of a standing wave of the bending secondary mode vibration maximizes.

<Operation Principal of Vibrator 1500>

Figure 16:
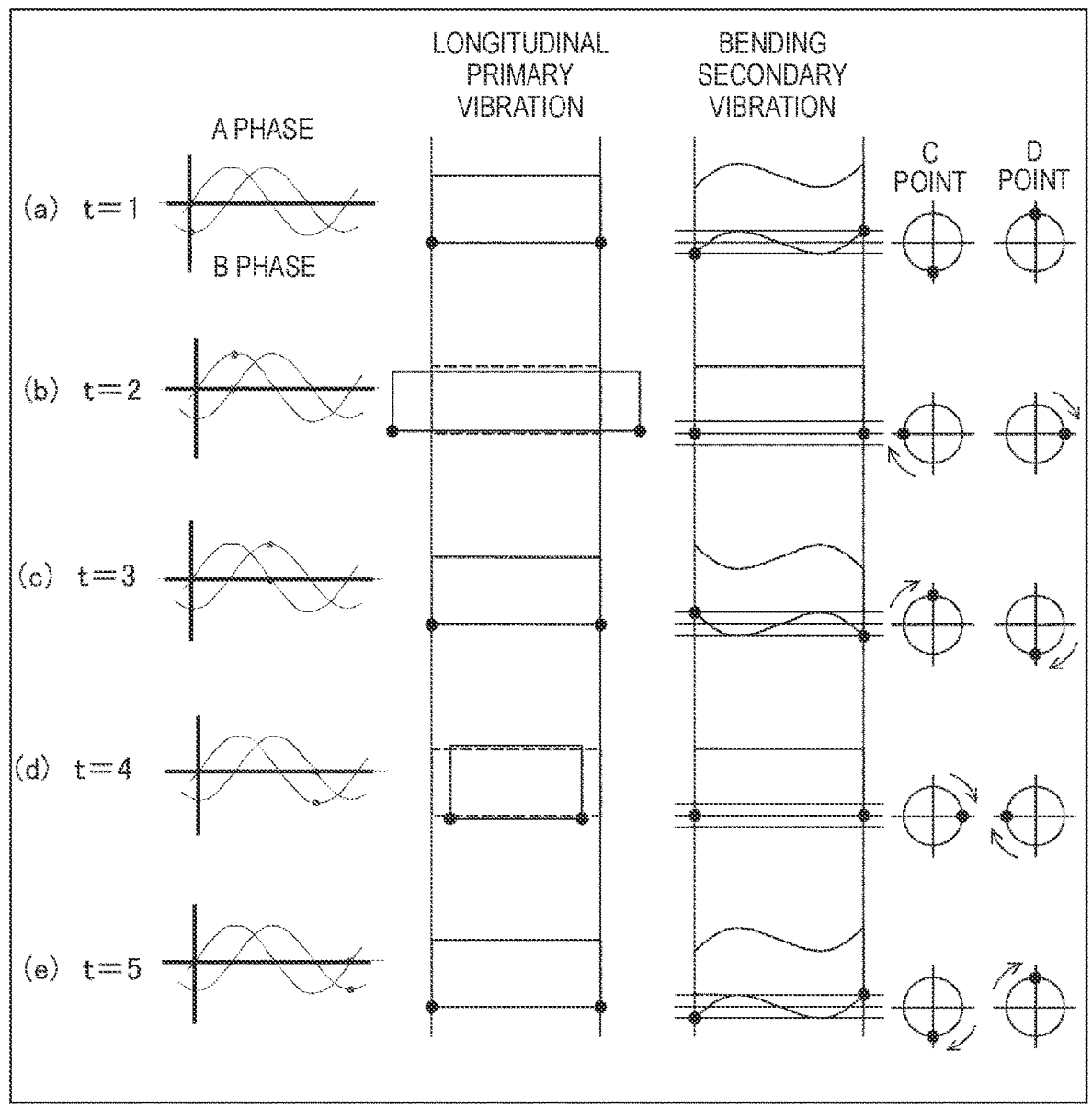
FIG. 16 is an explanatory view illustrating a driving principal of the vibrator according to embodiment 3.

FIG. 16 is an explanatory view illustrating a driving principal of the vibrator 1500 according to embodiment 3. FIG. 16(a) to (e) will be described in chronological order below. In graphs at left ends in FIG. 16(a) to (e), t represents a time, a vertical axis indicates a voltage, and a horizontal axis indicates a time.

t=1: A voltage of the A phase is 0, and a voltage of the B phase is minus. In this case, displacement of the longitudinal primary vibration is zero, and the bending secondary vibration which displaces a C point in a minus direction and displaces a D point in a plus direction occurs.

t=2: The voltage of the A phase is plus, and the voltage of the B phase is 0. In this case, the longitudinal primary vibration which causes displacement in the plus direction occurs, and displacement of the bending secondary vibration is zero.

t=3: The voltage of the A phase is 0, and the voltage of the B phase is plus. In this case, displacement of the longitudinal primary vibration is zero, and the bending secondary vibration which displaces the C point in the plus direction and displaces the D point in the minus direction occurs.

t=4: The voltage of the A phase is plus, and the voltage of the B phase is 0. In this case, the longitudinal primary vibration which causes displacement in the minus direction occurs, and displacement of the bending secondary vibration is zero.

t=5: Return to a case of t=1. When vibration is caused in this way, elliptical motions occur at the C point and the D point at which the sliding members 1560 are attached as illustrated at a right end in FIG. 16. When the mover is placed in pressure contact with these sliding members 1560, the mover is applied a friction force of the elliptical motions and driven. According to embodiment 3, the same material as that of embodiment 1 is used for the piezoelectric body 11, so that it is possible to obtain the same effect as that of embodiment 1.

Embodiment 4

Embodiment 4 describes an example where the vibration wave motor 1 is applied to a dust proof device including a camera. The same components as those of embodiment 1 will be assigned the same reference numerals, and description thereof will be omitted.

Figure 17:
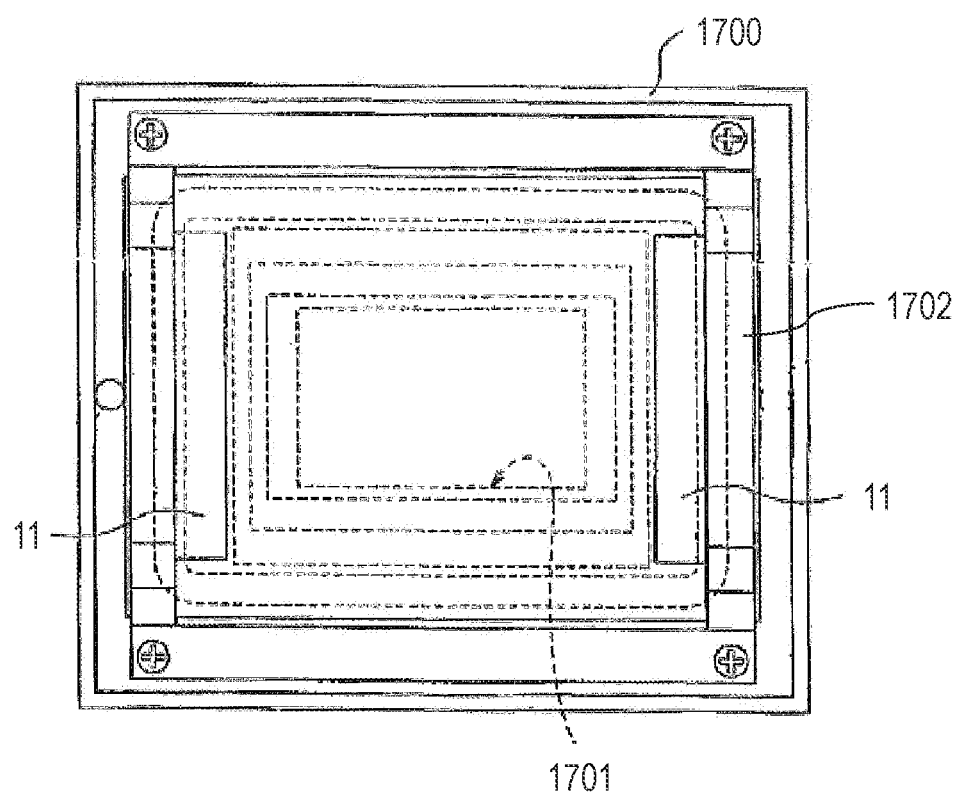
FIG. 17 is an explanatory view illustrating an example of the dust proof device according to embodiment 4.

FIG. 17 is an explanatory view illustrating an example of the dust proof device according to embodiment 4. The dust proof device 1700 is installed near an imaging element 1701, and vibration of the piezoelectric body 11 vibrates an optical filter 1702 to remove dust adhered to the optical filter 1702. The dust proof device 1700 according to embodiment 4 also includes the piezoelectric body 11 and the driving device 300. A task that a voltage of driving vibration from the driving device 300 fluctuates depending on the value of the electrostatic capacitance Cd of the piezoelectric body 11 is the same as that of the vibrator 10 of the vibration wave motor 1. According to embodiment 4, the same material as that of embodiment 1 is used for the piezoelectric body 11, so that it is possible to obtain the same effect as that of embodiment 1.

The present invention is not limited to the content above, and the content above may be freely combined. Also, other aspects considered to be within the scope of the technical concept of the present invention are included in the scope of the present invention.

EXPLANATION OF REFERENCES 1 vibration wave motor, 10 vibrator, 11 piezoelectric body, 12 elastic body, 12a driving surfaces, 12f bonding surface, 20 mover, 20a sliding surface, 300 driving device, 110 lens barrel, 200 lens barrel, 210 vibration wave motor, 211 vibrator, 214 elastic body, 216a driving surface, 220 mover, 1500 vibrator, 1700 dust proof device

What is claimed is:

1. A vibrator comprising an electromechanical transducer which is a piezoelectric ceramic made of sodium-potassium niobate metal oxides and whose temperature characteristics of a relative permittivity is 500 [ppm/° C.] or less in absolute value in a temperature range from −40° C. to 170° C.,
wherein excitation of the electromechanical transducer produces a vibration wave.

2. The vibrator according to claim 1, wherein the electromechanical transducer is consisted according to a following material chemical formula,

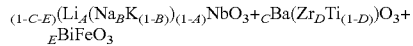

where $0<A<0.2$, $0.4 \leq B \leq 0.6$, $0<C \leq 0.1$, $0<D<1.00$, and $0<E<0.02$ hold.

3. The vibrator according to claim 1, wherein copper is added to the electromechanical transducer.

4. The vibrator according to claim 1, wherein a change percentage of an electrostatic capacitance of the electromechanical transducer which is yet to be bonded to the vibrator at −20° C. with respect to 60° C. is in a range of 4 to 12% in a temperature range from −20° C. to 60° C.

5. The vibrator according to claim 1, wherein a change percentage of an electrostatic capacitance of the electromechanical transducer which is yet to be bonded to the vibrator at 0° C. with respect to 60° C. is in a range of 0.5 to 3.9% in a temperature range from 0° C. to 60° C.

6. The vibrator according to claim 1, wherein a change percentage of an electrostatic capacitance of the electromechanical transducer which is yet to be bonded to the vibrator at 0° C. with respect to 25° C. is in a range of −0.2 to 0.7% in a temperature range from 0° C. to 25° C.

7. The vibrator according to claim 1, wherein a change percentage of an electrostatic capacitance of the vibrator to which the electromechanical transducer has been bonded at −20° C. with respect to 60° C. is in a range of 15 to 22% in a temperature range from −20° C. to 60° C.

8. The vibrator according to claim 1, wherein a change percentage of an electrostatic capacitance of the vibrator to which the electromechanical transducer has been bonded at 0° C. with respect to 60° C. is in a range of 6 to 11% in a temperature range from 0° C. to 60° C.

9. The vibrator according to claim 1, wherein a change percentage of an electrostatic capacitance of the vibrator to which the electromechanical transducer has been bonded at 0° C. with respect to 25° C. is in a range of 3 to 7% in a temperature range from 0° C. to 25° C.

10. A vibration wave motor comprising:
the vibrator according to claim 1; and
a relative motion member which includes a sliding surface placed in pressure contact with a driving surface of the vibrator, and is caused to make a relative motion by the vibration wave.

11. An optical device comprising:
the vibration wave motor according to claim 10; and
an optical element configured to drive by the vibration wave motor.

12. An optical device comprising:
the vibrator according to claim 1; and
an optical element configured to drive by the vibrator.

13. A vibrator comprising an electromechanical transducer which is a piezoelectric ceramic made of sodium-potassium niobate metal oxides and whose temperature characteristics of a relative permittivity is 390 [ppm/° C.] or less in absolute value in a temperature range from 0° C. to 60° C.,
wherein excitation of the electromechanical transducer produces a vibration wave.

* * * * *